United States Patent
Franz et al.

(10) Patent No.: US 9,448,602 B2
(45) Date of Patent: Sep. 20, 2016

(54) SYSTEM AND METHOD FOR COOLING INFORMATION HANDLING RESOURCES

(71) Applicants: Jason Franz, Austin, TX (US); James Bryan, Austin, TX (US); Bradley Jackson, Pflugerville, TX (US)

(72) Inventors: Jason Franz, Austin, TX (US); James Bryan, Austin, TX (US); Bradley Jackson, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 267 days.

(21) Appl. No.: 13/858,702

(22) Filed: Apr. 8, 2013

(65) Prior Publication Data

US 2013/0229770 A1  Sep. 5, 2013

Related U.S. Application Data

(63) Continuation of application No. 12/690,626, filed on Jan. 20, 2010, now Pat. No. 8,416,572.

(51) Int. Cl.
   *G06F 1/20* (2006.01)
   *H05K 7/20* (2006.01)

(52) U.S. Cl.
   CPC ............... *G06F 1/206* (2013.01); *G06F 1/20* (2013.01); *G06F 2200/201* (2013.01); *H01L 2924/0002* (2013.01); *H05K 7/20254* (2013.01)

(58) Field of Classification Search
   CPC .... G06F 1/20; G06F 1/206; G06F 2200/201; H05K 7/20218; H05K 7/20236; H05K 7/20254

USPC ......... 361/679.46–679.54, 688–723; 165/80.4–80.5, 104.33; 257/714; 174/15.1, 526, 547–548

See application file for complete search history.

(56) References Cited

U.S. PATENT DOCUMENTS

| | | | |
|---|---|---|---|
| 5,323,847 A | 6/1994 | Koizumi et al. | 165/104.33 |
| 5,706,668 A * | 1/1998 | Hilpert | G06F 1/20 361/690 |
| 6,313,990 B1 | 11/2001 | Cheon | 361/699 |
| 6,496,375 B2 | 12/2002 | Patel et al. | 361/719 |
| 6,519,146 B2 | 2/2003 | Nagashima et al. | 361/687 |
| 6,798,655 B2 | 9/2004 | Nagashima et al. | 361/687 |
| 6,963,488 B1 | 11/2005 | Chen | 261/679.49 |
| 7,110,258 B2 * | 9/2006 | Ding et al. | 361/699 |
| 7,295,436 B2 | 11/2007 | Cheon | 361/699 |
| 7,342,797 B2 | 3/2008 | Kamath et al. | 361/721 |
| 7,408,781 B1 | 8/2008 | Chen | 361/715 |
| 7,414,845 B2 | 8/2008 | Attlesey et al. | 361/699 |
| 7,471,514 B2 | 12/2008 | Chen | 361/695 |
| 2004/0008483 A1* | 1/2004 | Cheon | 361/687 |

(Continued)

FOREIGN PATENT DOCUMENTS

FR  WO2008/099085     8/2008
WO  WO 2008099085 A1 *  8/2008

*Primary Examiner* — Zachary M Pape
(74) *Attorney, Agent, or Firm* — Baker Botts L.L.P.

(57) ABSTRACT

Systems and methods for reducing problems and disadvantages associated with traditional approaches to cooling information handling resources are provided. A method for cooling information handling resources, may include conveying a flowing fluid proximate to one or more information handling resources such that the flowing fluid is thermally coupled to the one or more information handling resources and heat generated by the one or more information handling resources is transferred to the flowing fluid. The method may also include conveying the flowing fluid to a cooling unit such that heat is transferred from the flowing fluid.

15 Claims, 15 Drawing Sheets

(56) References Cited

U.S. PATENT DOCUMENTS

| | | | |
|---|---|---|---|
| 2006/0198103 A1 | 9/2006 | Ammirata | 361/695 |
| 2009/0279254 A1 | 11/2009 | Chen | 361/695 |
| 2010/0033932 A1* | 2/2010 | Thome et al. | 361/699 |
| 2010/0078157 A1 | 4/2010 | Roth | 165/104.34 |
| 2010/0259886 A1 | 10/2010 | Mongia | 261/679.47 |

\* cited by examiner

SYSTEM AND METHOD FOR COOLING INFORMATION HANDLING RESOURCES

CROSS-REFERENCE TO RELATED APPLICATIONS

This application is a continuation of pending U.S. patent application Ser. No. 12/690,626 filed Jan. 20, 2010; the contents of which is incorporated in its entirety by reference.

TECHNICAL FIELD

The present disclosure relates in general to cooling information handling resources, and more particularly to fluid cooling of individual components of an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the capabilities of information handling systems have improved, the power requirements of information handling systems and their component information handling resources have increased. Accordingly, the amount of heat produced by such information handling resources has also increased. Because the electrical properties of information handling resources may be adversely affected by the presence of heat (e.g., some information handling resources may not operate correctly outside of a particular range of temperatures), information handling systems often include cooling systems configured to cool such information handling resources.

Traditionally, information handling resources have been cooled via the impingement of air driven by one or more fans. As the density of information handling resources present in information handling systems have increased, and as information handling resources have become faster (and thus hotter), the airflow required to provide adequate cooling has increased, leading to the need for more powerful fans and/or greater numbers of fans. This leads to yet more power consumption, larger information handling system size, and excessive noise. In addition, because fans often transfer heat the those areas proximate to the information handling system being cooled, users of such information handling systems are often required to tolerate higher-than-typical temperatures.

As an improvement over traditional fan-based cooling systems, some information handling system manufacturers have provided mechanisms to cool individual component information handling resources with liquid. Such approaches use pumps to circulate cooling fluid over a heat exchanger plate or "cold plate") in contact with a component, and then to a liquid-to-air heat exchanger (e.g., radiator). Most such approaches to liquid cooling systems cool a handful of information handling resources with liquid, while the rest of the information handling system may be air cooled. Thus, such systems may still generate undesirable noise and discharge undesirable heat into an office space environment.

SUMMARY

In accordance with the teachings of the present disclosure, the disadvantages and problems associated with cooling information handling resources have been substantially reduced or eliminated.

In accordance with one embodiment of the present disclosure, a system for cooling information handling resources may include an information handling system and a cooling unit. The information handling system may include one or more information handling resources and one or more first fluidic conduits. The one or more first fluidic conduits may be configured to convey a flowing fluid proximate to the one or more information handling resources such that the flowing fluid is thermally coupled to the one or more information handling resources and heat generated by the one or more information handling resources is transferred to the flowing fluid. The cooling unit may have one or more second fluidic conduits fluidically coupled to the one or more first fluidic conduits and configured to convey the flowing fluid such that heat is transferred from the flowing fluid to media proximate to the cooling unit.

In accordance with another embodiment of the present disclosure, an information handling system may include one or more information handling resources and one or more first fluidic conduits. The one or more first fluidic conduits may be configured to convey a flowing fluid proximate to the one or more information handling resources such that the flowing fluid is thermally coupled to the one or more information handling resources and heat generated by the one or more information handling resources is transferred to the flowing fluid. The one or more first fluidic conduits may be configured to fluidically couple to a cooling unit configured to transfer heat from the flowing fluid.

In accordance with a further embodiment of the present disclosure, a method for cooling information handling resources, may include conveying a flowing fluid proximate to one or more information handling resources such that the flowing fluid is thermally coupled to the one or more information handling resources and heat generated by the one or more information handling resources is transferred to the flowing fluid. The method may also include conveying the flowing fluid to a cooling unit such that heat is transferred from the flowing fluid.

Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-6E, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, busses, memories, input-output devices and/or interfaces, storage resources, network interfaces, motherboards, electro-mechanical devices (e.g., fans), displays, and power supplies.

For the purposes of this disclosure, fluid conduits or fluidic conduits may broadly refer to any device, system or apparatus for the conveyance of fluid (e.g., tubing, a pipe, a hollow cylinder, a channel, a microchannel, etc.).

Figure 1:
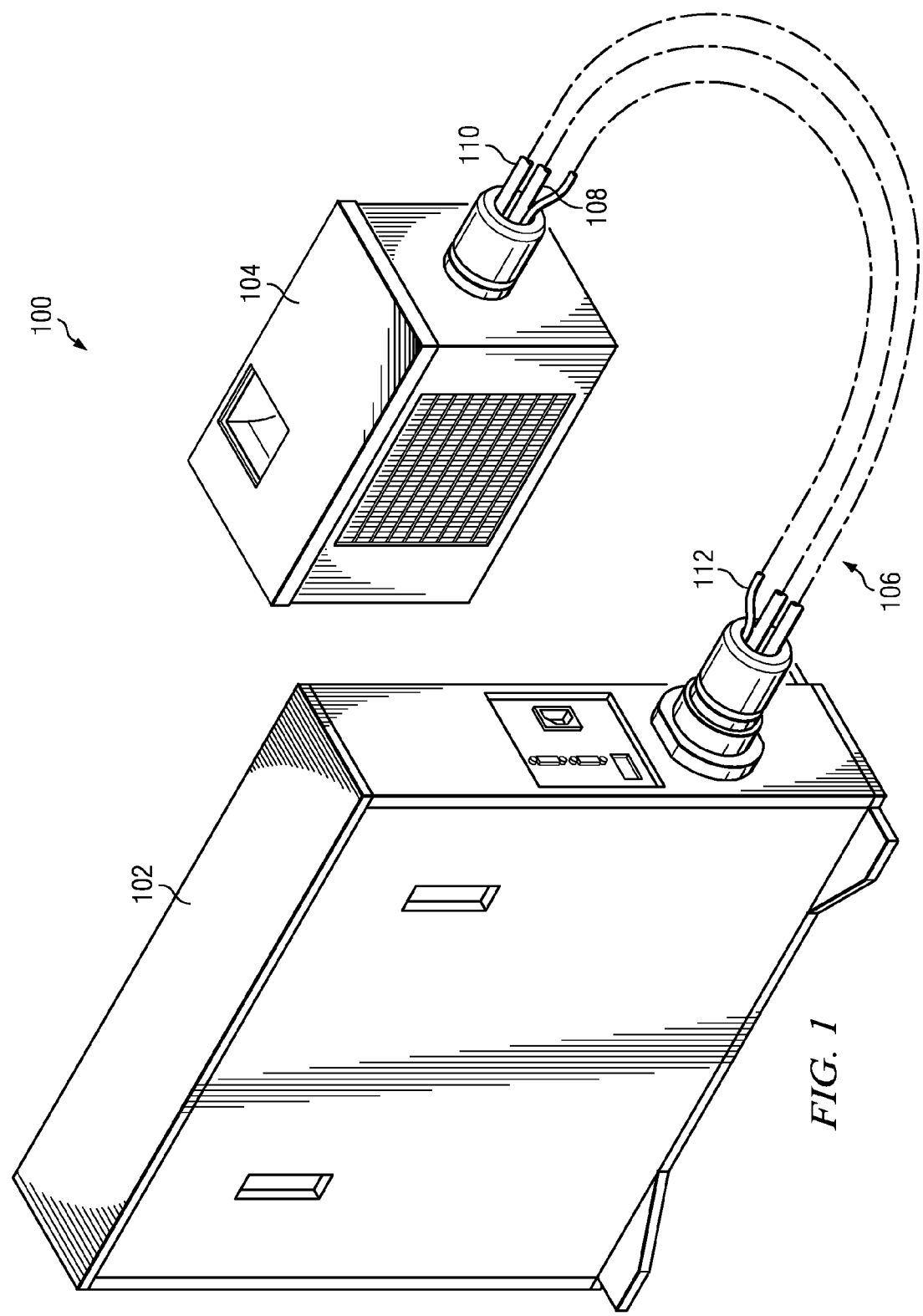
FIG. 1 illustrates a system for cooling component information handling resources of an information handling system, in accordance with embodiments of the present disclosure.

FIG. 1 illustrates a system 100 for cooling component information handling resources of an information handling system 102, in accordance with embodiments of the present disclosure. As shown in FIG. 1, system 100 may include an information handling system 102, a cooling unit 104, and an umbilical 106.

In certain embodiments, information handling system 102 may comprise a computer chassis or enclosure (e.g., a server chassis holding one or more server blades). In other embodiments, information handling system 102 may comprise a storage enclosure. In yet other embodiments, information handling system 102 may be a personal computer or workstation (e.g., a desktop computer or a portable computer).

Cooling unit 104 may be any system, device or apparatus configured to deliver a fluid to (e.g., via a pump) and/or receive a fluid from umbilical 106 and transfer heat from the fluid to another medium (e.g., air) in order to cool the fluid, in accordance with embodiments of the present disclosure.

Umbilical 106 may be any system, device or apparatus configured to fluidically couple and/or electrically couple information handling system 102 to cooling unit 104. Umbilical 106 may include one or more tubes or other fluid conduits 108, 110 configured to circulate fluid between information handling system 102 and cooling unit 104, in accordance with embodiments of the present disclosure. Fluid conduits 108, 110 comprising umbilical 106 may be made of plastic, metal, and/or any other suitable material. In addition, umbilical 106 may include one or more electrical conduits 112 (e.g., a collection of one or more conductive wires) to communicate electric and/or electronic signals between information handling system 102 and cooling unit 104.

In operation, cooling unit 104 may deliver a fluid (e.g., water, ethylene glycol, propylene glycol, or other coolant) to information handling system 102 via umbilical 106. Once delivered to information handling system 102, the fluid may be routed via one or more conduits and/or channels allowing the fluid to flow proximate to one or more information handling resources such that heat from such information handling resources is transferred to the fluid, as is described in greater detail below. The fluid may then return to cooling unit 104 via umbilical 106. Once returned to cooling unit 104, cooling unit 104 may transfer heat from the heated fluid to another medium (e.g., air) in order to cool the fluid, as is described in greater detail below. Accordingly, heat-producing information handling resources may be desirably cooled.

In some embodiments, information handling system 102 may not include a fan or other similar device to cause airflow within, into, or out of a case, chassis, or enclosure for information handling system 102. In these and other embodiments, the case, chassis, or enclosure for information handling system 102 may be closed such that no substantial airflow enters or leaves such case, chassis, or enclosure, and no substantial heat is transferred from the information handling resources of information handling system 102 to the environment immediately proximate to information handling system 102. Instead, substantially all of the heat generated by the one or more information handling resources may be emitted by cooling unit 104. In some embodiments, cooling unit 104 may be located substantially remotely from information handling system 102 (e.g., outside a cubicle, outside an office, outside a building, above ceiling tiles, below a floor) such that the information handling system is essentially silent and/or thermally neutral to a user local to information handling system 102.

Figure 2A:
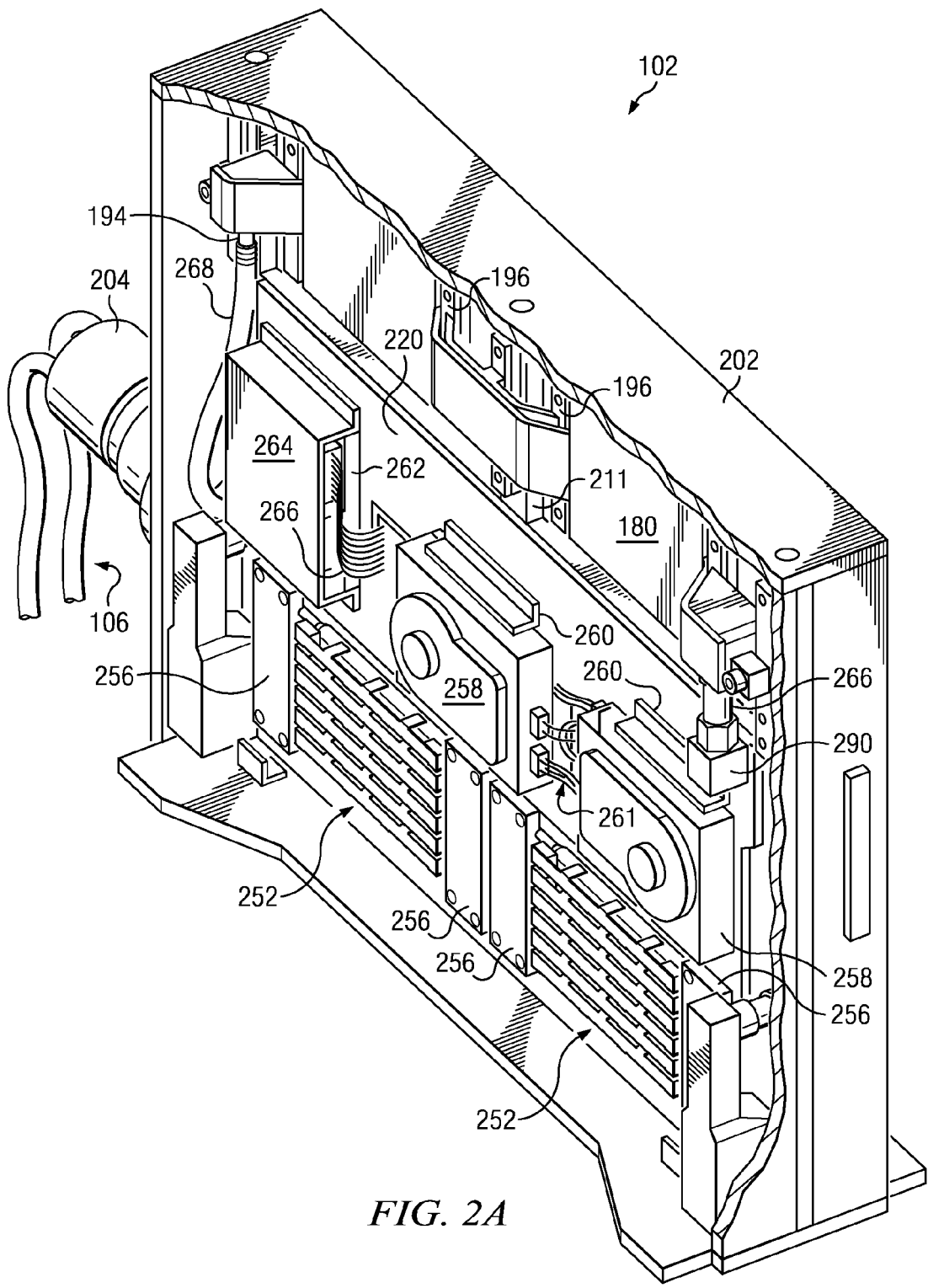
FIG. 2A illustrates an isometric view of selected components of an information handling system, in accordance with embodiments of the present disclosure.
Figure 2B:
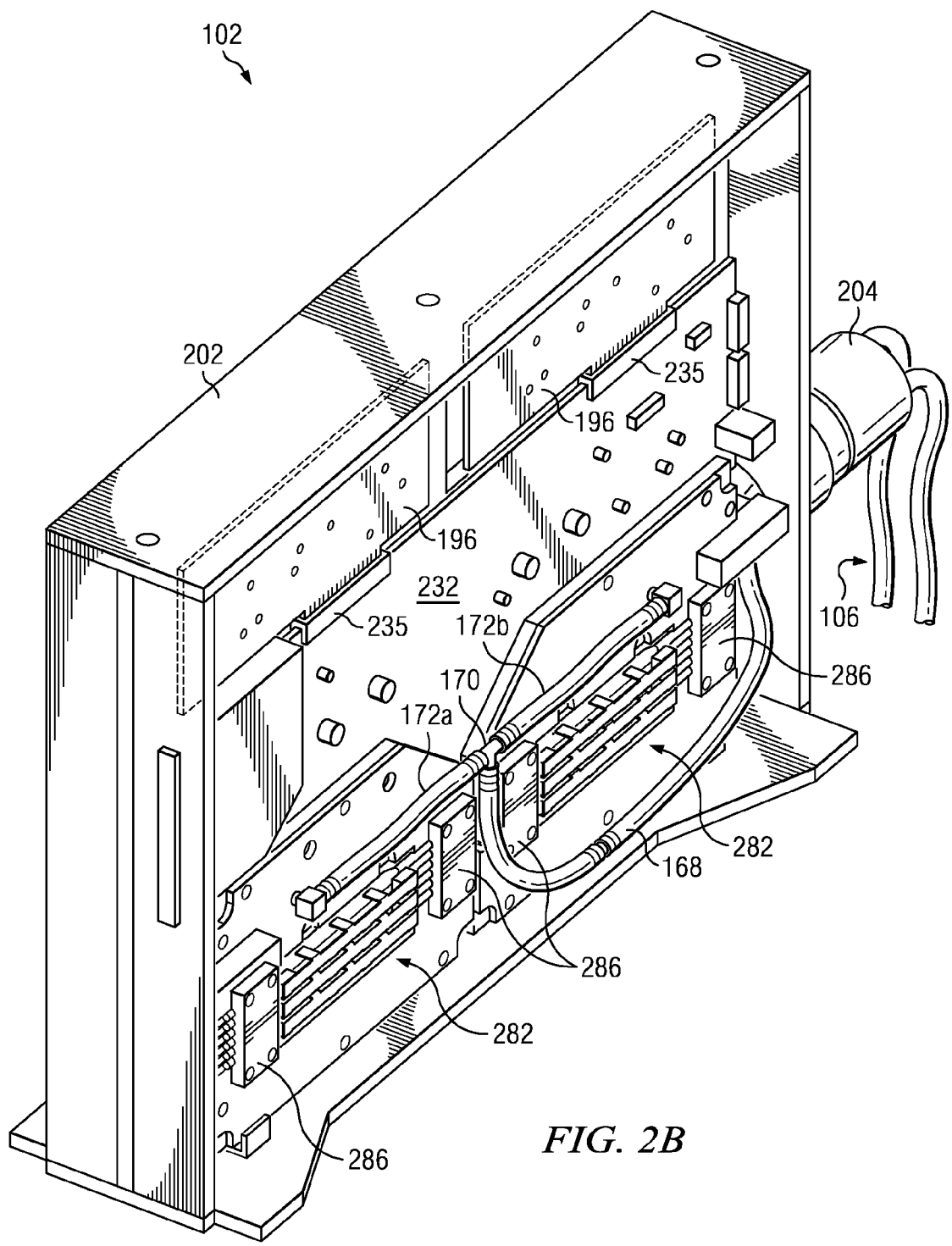
FIG. 2B illustrates another isometric view of selected components of an information handling system, in accordance with embodiments of the present disclosure.
Figure 2C:
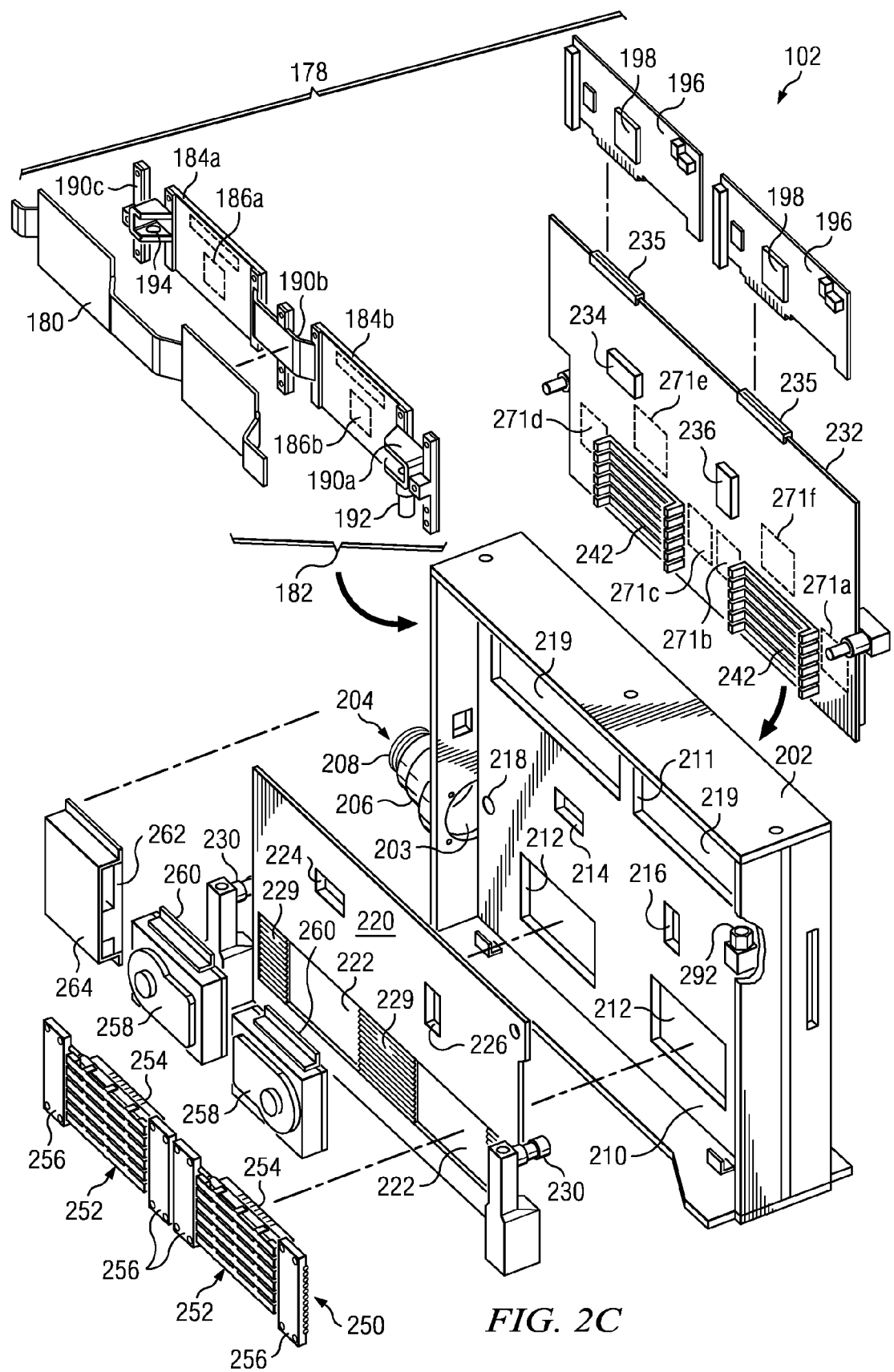
FIG. 2C illustrates an exploded view of selected components of an information handling system, in accordance with embodiments of the present disclosure.
Figure 2D:
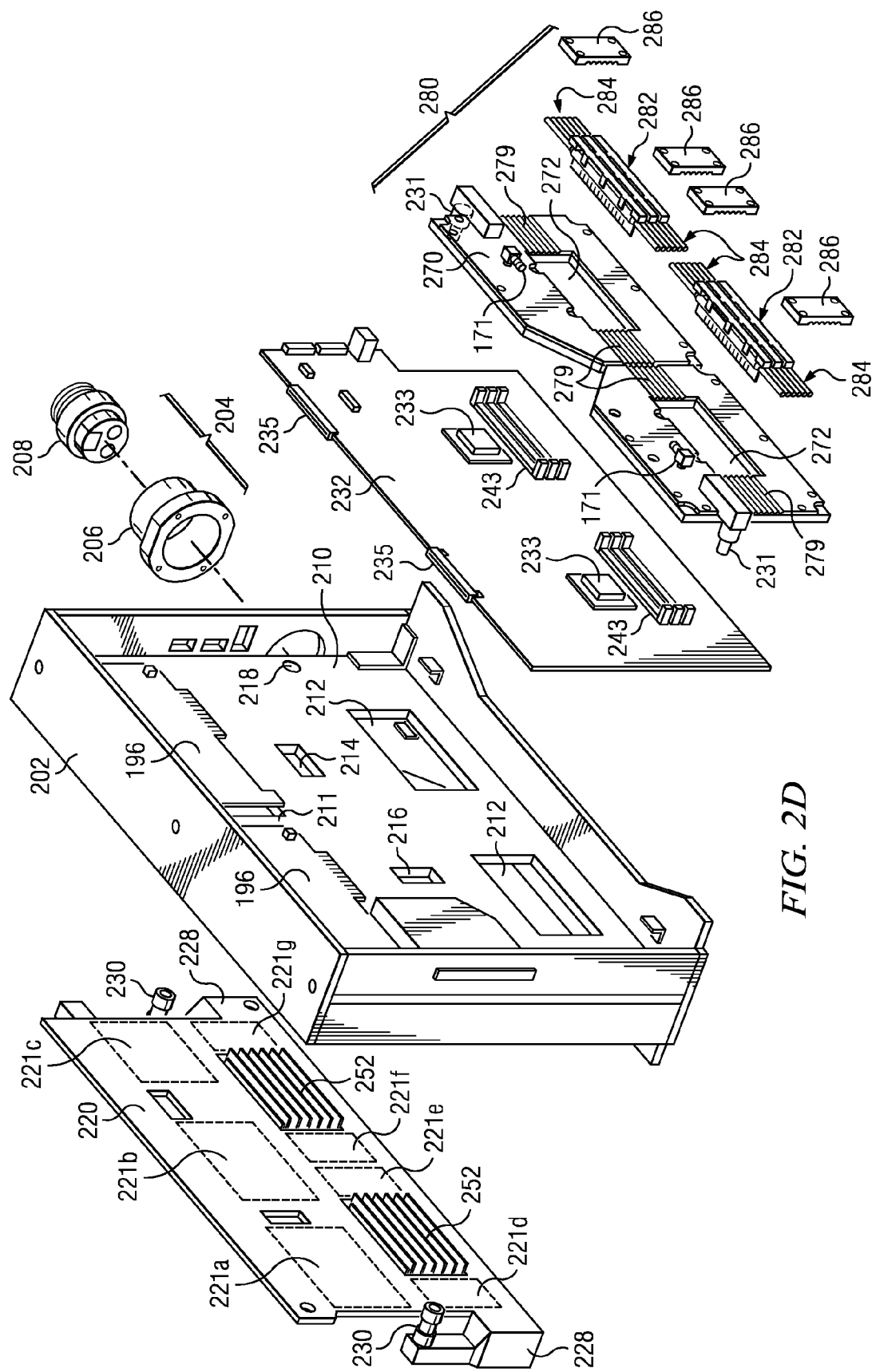
FIG. 2D illustrates a partially exploded view of selected components of an information handling system, in accordance with embodiments of the present disclosure.

FIGS. 2A-2D illustrate various views of selected components of information handling system 102, in accordance with embodiments of the present disclosure. FIG. 2A illustrates an isometric view of selected components of information handling system 102. FIG. 2B illustrates another isometric view of selected components of information handling system 102 from a perspective different than that of FIG. 2A. FIG. 2C illustrates an exploded view of selected components of information handling system 102 from the same perspective as FIG. 2A. FIG. 2D illustrates a partially exploded view of selected components of information handling system 102 from the same perspective as FIG. 2B.

As shown in FIGS. 2A-2D, information handling system 102 may include enclosure 202, umbilical assembly 204, support member 210, support member 220, support member 270, motherboard 232, memory assembly 250, memory assembly 280, expansion assembly 178, one or more hard drives 258, a power supply 262, and one or more fluid conduits 266, 268, 168, 170, and 172.

Enclosure 202 may be any cabinet or housing suitable to house and/or mount various components of information handling system 102. Enclosure 202 may be constructed from aluminum, plastic, and/or any other suitable material.

Umbilical assembly 204 may be any system, device or apparatus configured to fluidically couple and/or electrically couple umbilical 106 to information handling system 102. As shown in FIGS. 2A-2D, umbilical assembly 204 may include assembly cover 206 and fluidic coupler 208. Fluidic coupler 208 may be configured to couple individual fluid conduits 108, 110 of umbilical 106 to individual fluid conduits of information handling system 102 (e.g., via opening 203). Assembly cover 206 may be mechanically fixed to enclosure 202 and may be configured to mechanically couple fluidic coupler 208 to enclosure 202 at opening 203.

Support member 210 may include any system, device or apparatus configured to serve as a mount one or more components of information handling system 102 and/or configured to provide structural support to enclosure 202 and/or one or more components of information handling system 102. Support member 210 may be constructed from extruded aluminum, machined aluminum, case aluminum, and/or another suitable material. As shown in FIGS. 2A-2D, support member 210 may include extension 211, and one or more openings 212, 214, 216, 218, and 219. Extension 211 may be configured to provide structural support between the main portion of support member 210 and enclosure 202 and/or mount one or more components of information handling system 102 (e.g., expansion assembly 178). Openings 212, 214, 216, 218, and 219 may be provided to permit components of information handling system 102 on one side of support member 210 to be electrically, mechanically, and/or fluidically coupled to components on the other side of support member 210. For example, openings 212 may allow memory modules 252 of memory assembly 250 to be electrically and mechanically coupled to memory module connector 242 of motherboard 232. As another example, opening 214 may allow power supply 262 to be electrically coupled to connector 234 of motherboard 232 (e.g., via interface cabling 266). As a further example, opening 216 may allow either or both of hard drives 258 to be electrically coupled to connector 236 of motherboard 232 (e.g., via interface cabling 261). As yet another example, opening 218 may permit quick disconnect fluid fitting 230 of support member 220 to be fluidically coupled to fluid fitting 231 of support member 270.

Support member 220 may be mechanically coupled to support member 210 via one or more screws, fasteners, adhesives, and/or other suitable means, and may include any system, device or apparatus configured to serve as a mount and/or provide structural support for one or more components of information handling system 102. Support member 220 may be constructed from extruded aluminum, machined aluminum, case aluminum, and/or another suitable material. In some embodiments, all or one or more portions of support member 220 may comprise a material (e.g., aluminum or other metal) that is generally thermally conductive. As shown in FIGS. 2A-2D, support member 220 may include openings 222, 224, and 226, one or more features 229, and one or more quick disconnect fluid fittings 230.

Openings 222, 224, and 226 may be provided to permit components of information handling system 102 mechanically coupled to one side of support member 220 to be electrically, mechanically, and/or fluidically coupled to components on the other side of support member 220. For example, openings 222 may allow memory modules 252 of memory assembly 250 to be electrically and mechanically coupled to memory module connector 242 of motherboard 232. As another example, opening 224 may allow power supply 262 to be electrically coupled to connector 234 of motherboard 232 (e.g., via interface cabling 266). As a further example, opening 226 may allow either or both of hard drives 258 to be electrically coupled to connector 236 of motherboard 232 (e.g., via interface cabling 261).

Figure 3A:
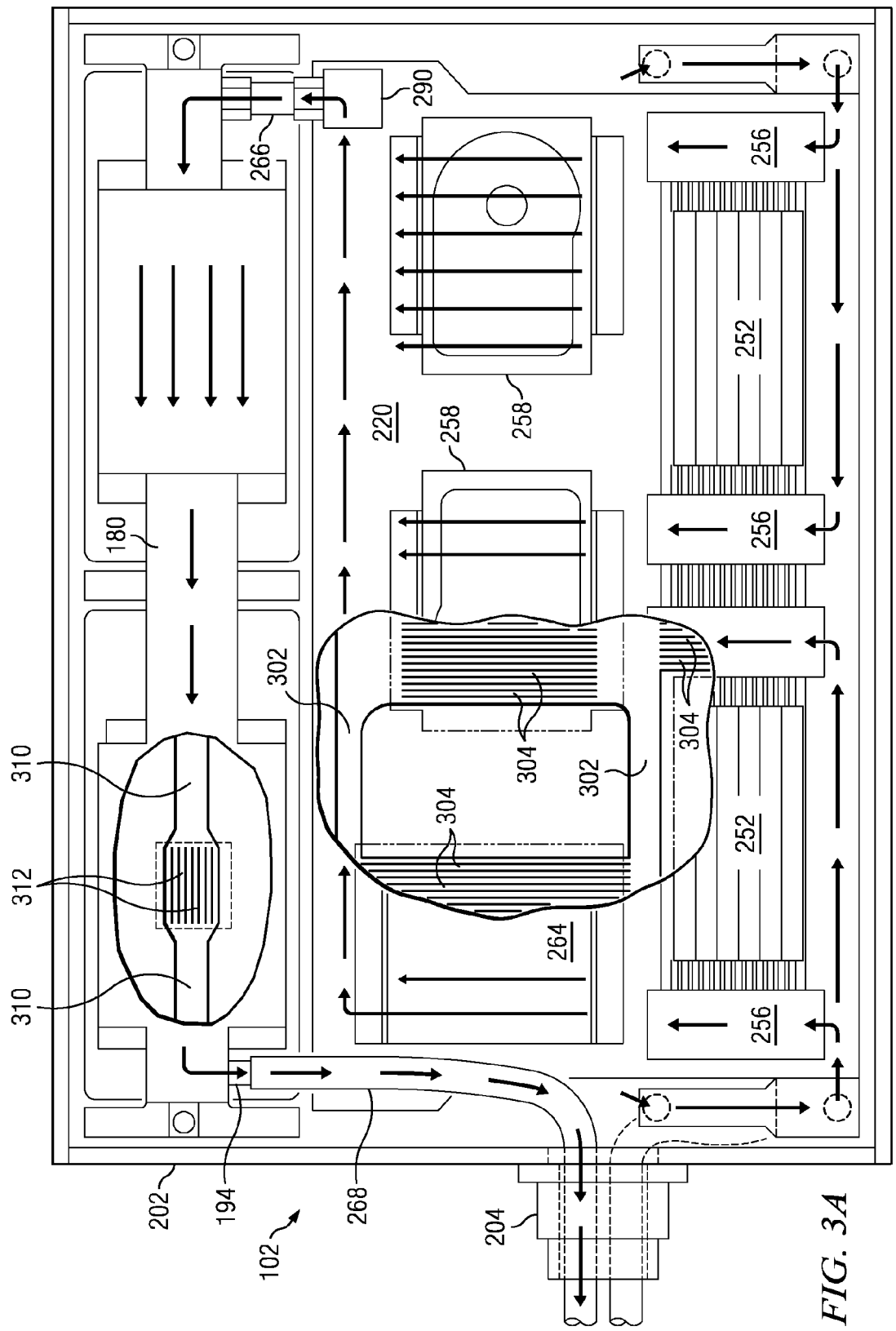
FIGS. 3A and 3C illustrate a cutaway view of selected components of the information handling system depicted in FIGS. 2A-2D, such that selected fluidic channels are depicted, in accordance with embodiments of the present disclosure.
Figure 3B:
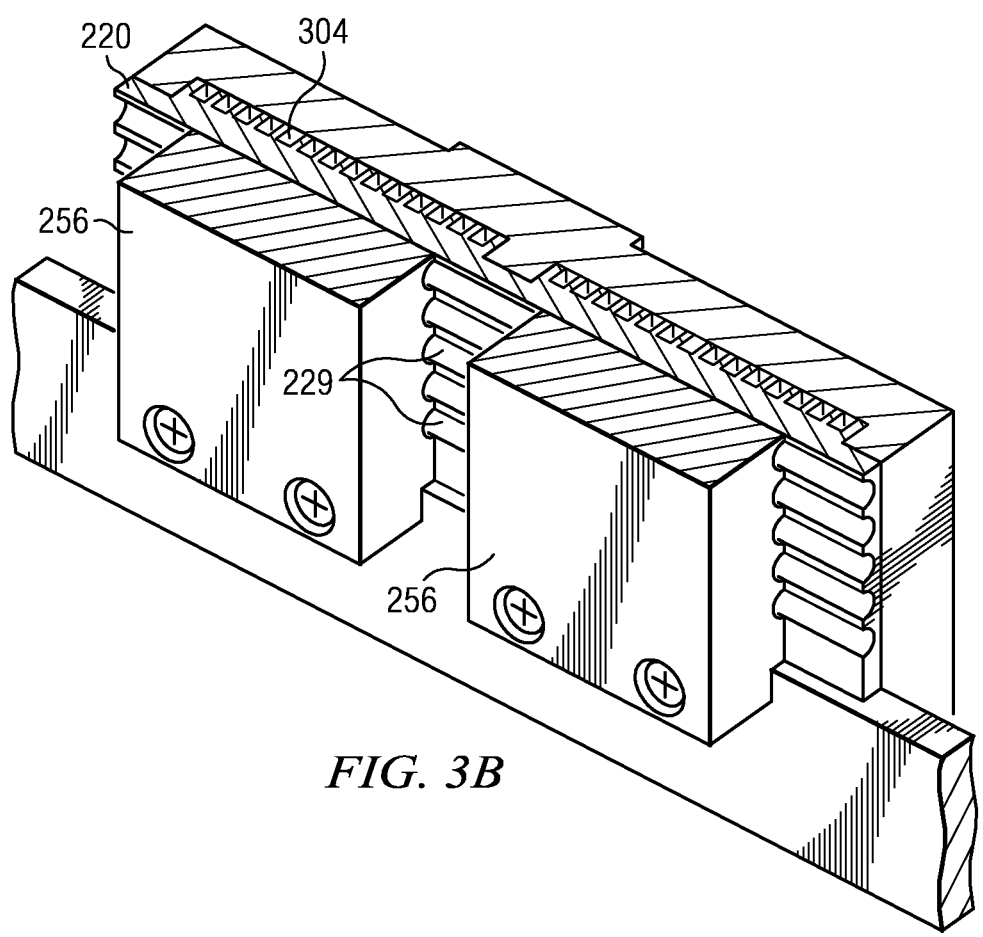
FIG. 3B illustrates fluidic channels created within the interior of certain support members and cold plates, in accordance with the present disclosure.

Turning briefly to FIGS. 3A and 3B, support member 220 may include fluid channels 302 and fluid microchannels 304 formed predominantly on the interior of support member 220. Fluid channels 302 may include any suitable channel configured to transport fluid to, from, or within support member 220 and may be formed by machining, extrusion, or other suitable manner. The position, length, height, width, and other physical characteristics of fluid channels 302 may be selected based on desired cooling characteristics, desired fluid flow rates, desired fluid type, component types, component locations, expected component heat generation, and/or any other suitable characteristics of information handling system 102. Fluid channels 302 of support member 220 may be fluidically coupled to one or more of a quick disconnect fluid fitting 230, a fluid microchannel 304, or another fluid channel 302.

Fluid microchannels 304 may include any suitable channel configured to transport fluid within support member 220 and may be formed by machining, extrusion, or other suitable manner. The position, length, height, width, and other physical characteristics of fluid microchannels 304 may be selected based on desired cooling characteristics, desired fluid flow rates, desired fluid type, component types, component locations, expected component heat generation, and/or any other suitable characteristics of information handling system 102. In some embodiments, fluid microchannels 304 may be positioned at particular microchannel regions 221 within support member 220. The microchannel regions 221 may be sized and/or located within support member 220 such that when information handling system 102 is constructed, each microchannel region 221 is thermally coupled to a particular information handling resource (e.g., hard drive 258, power supply 262, memory module 252) by virtue of proximity between the fluid flowing in the fluid microchannel 304 and the information handling resource, and the presence of one or more generally thermally conductive materials (e.g., a portion of the surface of support member 220) between the fluid and the information handling resource.

Turning again to FIGS. 2A-2D, features 229 may include any structure suitable to mechanically support one or more heat sinks (e.g., heat sinks 254) on support member 220, and may be formed by machining, extrusion, or other suitable manner. The position, length, height, width, and other physical characteristics of features 229 may be selected based on the size and/or shape of heat sinks 254, the size and/or shape of microchannel regions 221, and/or any other suitable characteristics of information handling system 102. For example, as shown in FIGS. 2A-2D, features 229 may have a semi-cylindrical shape in embodiments in which heat sinks 254 have a cylindrical shape.

Support member 220 may also include one or more quick disconnect fluid fittings 230. Each quick disconnect fluid fitting 230 may be made from plastic, rubber, or other suitable material and may be any system, device or apparatus configured to couple fluid channels 302 of support member 220 to fluid channels 306 of support member 270 via quick disconnect fluid fitting 231.

Support member 270 may be mechanically coupled to support member 210 via one or more screws, fasteners, adhesives, and/or other suitable means, and may include any system, device or apparatus configured to serve as a mount and/or provide structural support for one or more components of information handling system 102. Support member 270 may be constructed from extruded aluminum, machined aluminum, case aluminum, and/or another suitable material. In some embodiments, all or one or more portions of support member 270 may comprise a material (e.g., aluminum or other metal) that is generally thermally conductive. As shown in FIGS. 2A-2D, support member 270 may include openings 272, one or more features 279, and one or more quick disconnect fluid fittings 231.

Openings 272 may be provided to permit components of information handling system 102 mechanically coupled to one side of support member 270 to be electrically, mechanically, and/or fluidically coupled to components on the other side of support member 270. For example, openings 272 may allow memory modules 282 of memory assembly 280 to be electrically and mechanically coupled to memory module connector 243 of motherboard 232.

Figure 3C:
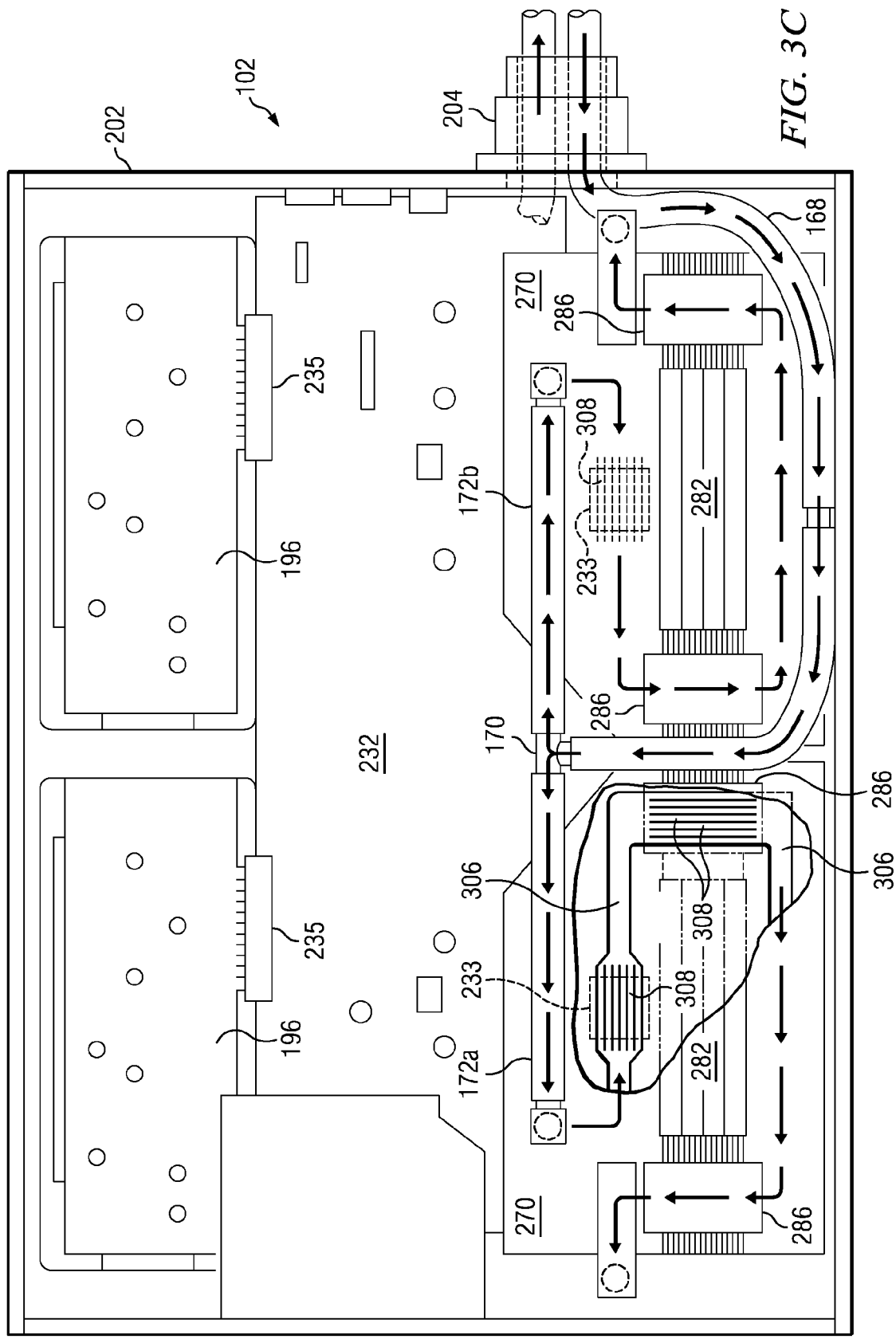

Turning briefly to FIG. 3C, support member 270 may include fluid channels 306 and fluid microchannels 308 formed predominantly on the interior of support member 270. Fluid channels 306 may include any suitable channel configured to transport fluid to, from, or within support member 270 and may be formed by machining, extrusion, or other suitable manner. The position, length, height, width, and other physical characteristics of fluid channels 306 may be selected based on desired cooling characteristics, desired fluid flow rates, desired fluid type, component types, component locations, expected component heat generation, and/or any other suitable characteristics of information handling system 102. In some embodiments, fluid channels 306 may be identical or similar to fluid channels 302. Fluid channels 306 of support member 270 may be fluidically coupled to one or more of a quick disconnect fluid fitting 231, a fluid microchannel 308, or another fluid channel 306.

Fluid microchannels 308 may include any suitable channel configured to transport fluid within support member 270 and may be formed by machining, extrusion, or other suitable manner. The position, length, height, width, and other physical characteristics of fluid microchannels 308 may be selected based on desired cooling characteristics, desired fluid flow rates, desired fluid type, component types, component locations, expected component heat generation, and/or any other suitable characteristics of information handling system 102. In some embodiments, fluid microchannels 308 may be positioned at particular microchannel regions 271 within support member 270. The microchannel regions 271 may be sized and/or located within support member 270 such that when information handling system 102 is constructed, each microchannel region 271 is thermally coupled to a particular information handling resource (e.g., processor 233, memory module 282) by virtue of proximity between the fluid flowing in the fluid microchannel 308 and the information handling resource, and the presence of one or more generally thermally conductive materials (e.g., a portion of the surface of support member 270) between the fluid and the information handling resource.

Turning again to FIGS. 2A-2D, features 279 may include any structure suitable to mechanically support one or more heat sinks (e.g., heat sinks 284) on support member 270, and may be formed by machining, extrusion, or other suitable manner. The position, length, height, width, and other physical characteristics of features 279 may be selected based on the size and/or shape of heat sinks 284, the size and/or shape of microchannel regions 271, and/or any other suitable characteristics of information handling system 102. For example, as shown in FIGS. 2A-2D, features 279 may have a semi-cylindrical shape in embodiments in which heat sinks 284 have a cylindrical shape.

Support member 270 may also include one or more quick disconnect fluid fittings 231. Each quick disconnect fluid fitting 231 may be made from plastic, rubber, or other suitable material and may be any system, device or apparatus configured to couple fluid channels 306 of support member 270 to fluid channels 302 of support member 220 via quick disconnect fluid fitting 230.

One or more of fluid conduits 168, 170, and 172 may include any device, system or apparatus for the conveyance of fluid (e.g., tubing, a pipe, a hollow cylinder). For example, as depicted in FIG. 3C, fluid conduit 168 may fluidically couple umbilical 106 to fluid conduit 170, fluid conduit 170 may fluidically couple fluid conduit 168 to fluid conduits 172, and/or fluid conduits 172 may fluidically couple fluid conduit 170 to one or more fluid channels 306 of support member 270. Other fluid conduits or channels not shown in FIGS. 2A-2D may also be present in information handling system 102. Fluid conduits 168, 170, and 172 may be made of plastic, metal, and/or any other suitable material.

Motherboard 232 may include a printed circuit board configured to provide structural support for one or more components of information handling system 102 and/or electrically couple one or more of such components to each other or to other electric or electronic components external to information handling system 102. As shown in FIGS. 2A-2D, motherboard 232 may include one or more processors 233, one or more expansion slots 235, one or more connectors 234, and 236, and one or more memory slots 242 and 243.

Each processor 233 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 233 may interpret and/or execute program instructions and/or process data stored in one or more of memory modules 252, 282, and/or another component of information handling system 102.

Each connector 234, 236 may include any system, device or apparatus configured to electrically couple an information handling resource or other component of information handling system 102 to one or more other components of information handling system 102. For example, as shown in FIGS. 2A-2D, connector 234 may be adapted to electrically couple power supply 262 to motherboard 232 and other components of information handling system 102. Similarly, as shown in FIGS. 2A-2D, connector 234 may be adapted to electrically couple hard drives 258 to motherboard 232 and other components of information handling system 102, for example.

Each expansion slot 235 may include any system, device or apparatus configured to electrically couple an information handling resource or other component of information handling system 102 to one or more other components of information handling system 102. For example, as shown in FIGS. 2A-2D, each expansion slot 235 may have a generally rectangular prism or cuboid shape and may be configured to removably receive corresponding mating edge connectors of a card (e.g., a video graphics card or other expansion card). In some embodiments, each expansion slot 235 may comprise a peripheral component interconnect (PCI) connector or peripheral component interconnect express (PCIe) connector.

Each memory slot 242, 243 may include any system, device or apparatus configured to electrically couple a memory module 252, 282 to one or more other components of information handling system 102. For example, as shown in FIGS. 2A-2D, each memory slot 242, 243 may have a generally rectangular prism or cuboid shape and may be configured to removably receive corresponding mating edge connectors of a memory module (e.g., a single-inline memory module or dual-inline memory module).

In some embodiments, one or more of processors 233 may be positioned on motherboard 232 such that the processor 233 is thermally coupled to fluid flowing in a microchannel region 271 having fluid microchannels 308 by virtue of proximity between the fluid flowing in the fluid microchannel 308 and the processor 233, and the presence of one or more generally thermally conductive materials (e.g., a portion of the surface of support member 270) between the fluid and the processor 233.

Memory assembly 250 may include one or more memory modules and one or more components configured to thermally couple and/or mechanically couple such memory modules to support member 220. For example, as shown in FIGS. 2A-2D, memory assembly 250 may include one or more memory modules 252, one or more heat sinks 254, and one or more brackets 256.

Each memory module 252 may include a printed circuit board or other system, device, or apparatus whereupon one or more memory integrated circuits configured to store data and/or instructions for a period of time (e.g., static random access memory, dynamic random access memory, FLASH, and/or other suitable type of memory). For example, each memory module 252 may comprise a dual inline memory module (DIMM). Memory module 252 may be mechanically and/or electrically coupled to motherboard 232 via memory module connector 242. For example, each memory module 252 may include an edge connector configured to mount memory module 252 in memory module connector 242. In some embodiments, memory module 252 may be mechanically coupled to motherboard 232 such that memory module 252 and/or the surfaces of integrated circuits mounted thereto may be substantially perpendicular to the surface of motherboard 232, as shown in FIGS. 2A-2D.

Figure 4:
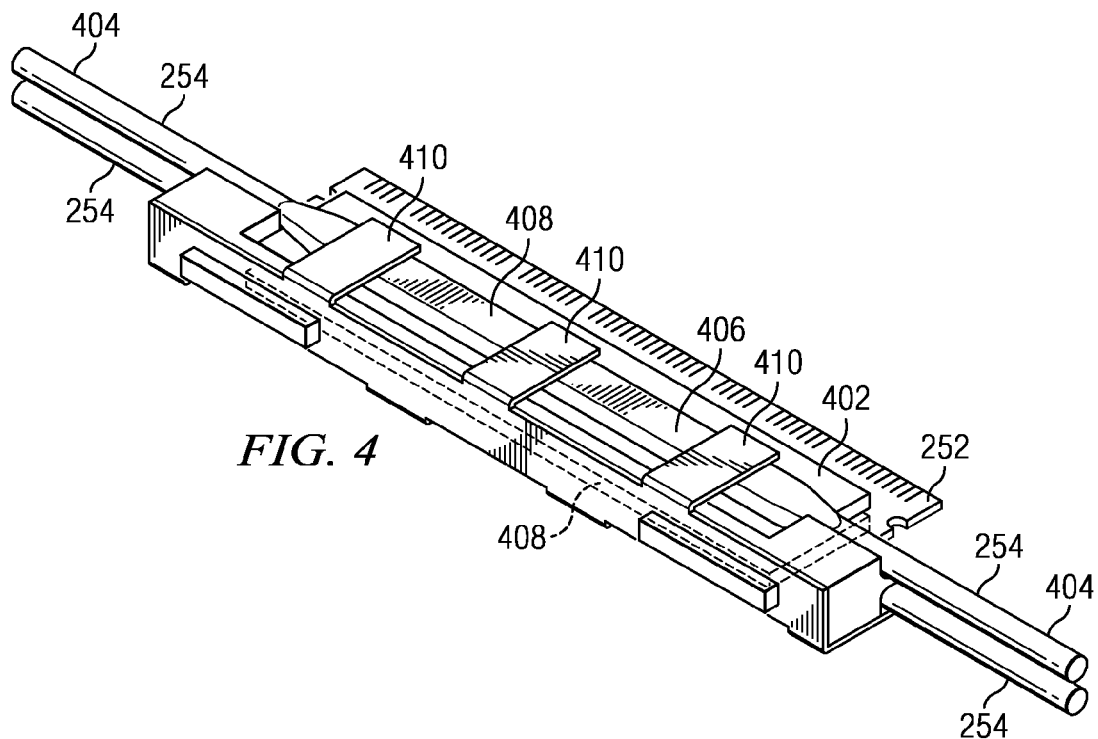
FIG. 4 depicts a memory module with heat sinks mechanically and thermally coupled thereto, in accordance with embodiments of the present disclosure.

Each heat sink 254 may comprise any system, device, or apparatus configured to thermally couple one or more integrated circuits (e.g., memory integrated circuits) mounted on one side of a corresponding memory module 252 to support member 220. For example, turning briefly to FIG. 4, an individual memory module 252 having two heat sinks 254 coupled to the memory module 252 is depicted. Each heat sink 254 may be generally conductive of heat, and accordingly may include or be made from copper, aluminum, or another material that is generally conductive of heat. As shown in FIG. 4, each heat sink 254 may include two end portions 404 and a middle portion 402. Although depicted as different portions in FIG. 4, end portions 404 and middle portion 402 of each heat sink 254 may be formed from the same piece of material. The middle portion 402 may include a trace 406 and a contact plate 408 mechanically and thermally coupled to the trace 406 (e.g., trace 406 may be coupled to contact plate 408 via an adhesive or trace 406 and 408 may be formed from the same piece of material). Contact plate 408 may in turn be thermally coupled to integrated circuits mounted on memory module 252, as discussed in greater detail below.

Clamps 410 may mechanically couple one or two heat sinks 254 to each memory module 252. Such mechanical coupling facilitates thermal coupling between integrated circuits mounted on memory module 252 and contact plates 408. Accordingly, heat generated by integrated circuits mounted on memory module 252 may be conducted to contact plate 408 by virtue of contact plate 408 being in direct contact or in proximity with such integrated circuits. The heat may further be conducted to trace 406, and then to end portions 404. Each end portion 404 may be also be thermally coupled to support member 220 (e.g., proximate to a microchannel region 221) thus allowing heat generated by integrated circuits of memory module 252 to be transferred to fluid flowing in support member 220.

The position, length, height, width, shape, and other physical characteristics of each portion of each heat sink 254 may be selected based on desired cooling characteristics, desired fluid flow rates, desired fluid type, component types, component locations, expected component heat generation, and/or any other suitable characteristics of memory modules 252 and information handling system 102. For example, because the surfaces of integrated circuits on a memory module are often substantially co-planar, contact plate 408 may have a planar surface sized and shaped to cover the surface of each such integrated circuit. Likewise, trace 406 may be have the general shape of a rectangular cube with a small height, to effectively transfer heat from contact plate 408 to end portions 404 while allowing for memory modules 252 to be mounted as densely as possible in information handling system 102 in order to achieve a desired memory density in information handling system 102. As another example, end portions 404 may have the general shape of cylinders, potentially maximizing the contact surface area (and thus thermal conductivity) between heat sinks 254 and features 229, as well as facilitating mechanical coupling of memory assembly 250 to support member 220.

Turning again to FIGS. 2A-2D, brackets 256 may be coupled to support member 220 via screws, fasteners, adhesives, and/or other suitable means, and may include any structure suitable to mechanically support one or more heat sinks (e.g., heat sinks 254) on support member 220, and may be formed by machining, extrusion, or other suitable manner. The position, length, height, width, and other physical characteristics of brackets 256 may be selected based on the size and/or shape of heat sinks 254, and/or any other suitable characteristics of information handling system 102. For example, as shown in FIGS. 2A-2D, a side of each bracket 256 proximate to heat sinks 254 may have a semi-cylindrical shape in embodiments in which heat sinks 254 have a cylindrical shape.

Memory assembly 280 may include one or more memory modules and one or more components configured to thermally couple and/or mechanically couple such memory modules to support member 270. For example, as shown in FIGS. 2A-2D, memory assembly 280 may include one or more memory modules 282, one or more heat sinks 284, and one or more brackets 286.

Each memory module 282 may include a printed circuit board or other system, device, or apparatus whereupon one or more memory integrated circuits configured to store data and/or instructions for a period of time (e.g., static random access memory, dynamic random access memory, FLASH, and/or other suitable type of memory). For example, each memory module 282 may comprise a dual inline memory module (DIMM). Memory module 282 may be mechanically and/or electrically coupled to motherboard 232 via memory module connector 243. For example, each memory module 282 may include an edge connector configured to mount memory module 282 in memory module connector 243. In some embodiments, memory module 282 may be mechanically coupled to motherboard 232 such that memory module 282 and/or the surfaces of integrated circuits mounted thereto may be substantially perpendicular to the surface of motherboard 282, as shown in FIGS. 2A-2D. In these and other embodiments, memory modules 282 may be identical or similar to memory modules 252.

Each heat sink 284 may comprise any system, device, or apparatus configured to thermally couple one or more integrated circuits (e.g., memory integrated circuits) mounted on one side of a corresponding memory module 282 to support member 270. For example, each sink 284 may be identical or similar to heat sink 254 depicted in FIG. 4, and may be mechanically and/or thermally coupled to support member 270 and/or integrated circuits of memory modules 282 in a manner identical or similar to that depicted in FIG. 4. Each heat sink 284 may be also be thermally coupled to support member 270 (e.g., proximate to a microchannel region 271) thus allowing heat generated by integrated circuits of memory module 282 to be transferred to fluid flowing in support member 270.

The position, length, height, width, shape, and other physical characteristics of each portion of each heat sink 284 may be selected based on desired cooling characteristics, desired fluid flow rates, desired fluid type, component types, component locations, expected component heat generation, and/or any other suitable characteristics of memory modules 282 and information handling system 102.

Brackets 286 may be coupled to support member 270 via screws, fasteners, adhesives, and/or other suitable means, and may include any structure suitable to mechanically support one or more heat sinks (e.g., heat sinks 284) on support member 270, and may be formed by machining, extrusion, or other suitable manner. The position, length, height, width, and other physical characteristics of brackets 286 may be selected based on the size and/or shape of heat sinks 284, and/or any other suitable characteristics of information handling system 102. For example, as shown in FIGS. 2A-2D, a side of each bracket 286 proximate to heat sinks 284 may have a semi-cylindrical shape in embodiments in which heat sinks 284 have a cylindrical shape.

Each hard drive 258 may include any non-volatile storage device which stores data. As depicted in FIGS. 2A-2D, each hard drive 258 may be mechanically coupled to support member 220 via a bracket 260 and/or electrically coupled to motherboard 232 via interface cabling 261. Each bracket 260 may itself be mechanically coupled to each of hard drive 258 and support member 220 via screws, fasteners, adhesives, and/or other suitable means. In some embodiments, one or more of hard drives 258 may be mechanically coupled to support member 220 such that the hard drive 258 is thermally coupled to fluid flowing in a microchannel region 221 having fluid microchannels 304 by virtue of proximity between the fluid flowing in the fluid microchannel 304 and the hard drive 258, and the presence of one or more generally thermally conductive materials (e.g., a portion of the surface of support member 220) between the fluid and the hard drive 258.

Power supply 262 may include any device, system, or apparatus operable to supply electrical energy to one or more components of information handling system 102. As depicted in FIGS. 2A-2D, power supply 262 may be mechanically coupled to support member 220 via a bracket 262 and/or electrically coupled to motherboard 232 via interface cabling 266. Each bracket 262 may itself be mechanically coupled to power supply 262 and support member 220 via screws, fasteners, adhesives, and/or other suitable means. In some embodiments, power supply 262 may be mechanically coupled to support member 220 such that power supply 262 is thermally coupled to fluid flowing in a microchannel region 221 having fluid microchannels 304 by virtue of proximity between the fluid flowing in the fluid microchannel 304 and power supply 262, and the presence of one or more generally thermally conductive materials (e.g., a portion of the surface of support member 220) between the fluid and power supply 262.

Expansion assembly 178 may include one or more expansion cards and one or more components configured to mechanically couple such expansion cards to support member 210 and/or motherboard 232 and/or to thermally couple such expansion cards to cold plates. For example, as shown in FIGS. 2A-2D, expansion assembly 178 may include a cover 180, cold plate assembly 182, and one or more expansion cards 196. Coldplate assembly 182 may be mechanically coupled to support member 210 at mounting locations on brackets 190 via one or more screws, fasteners, adhesives, and/or other suitable means, and may include any system, device or apparatus configured to serve as a mount and/or provide structural support for expansion cards 196. The position, length, height, width, and other physical characteristics of coldplate assembly 182 may be selected based on desired cooling characteristics, desired fluid flow rates, desired fluid type, component types, component locations, expected component heat generation, and/or any other suitable characteristics of information handling system 102.

Cover 180 may be any suitable apparatus for sealing or covering cold plates 184. Cover 180 may be made from any suitable material, including without limitation plastic.

Each expansion card 196 may include a printed circuit board or other system, device, or apparatus that may be inserted into an expansion slot 235 of motherboard 232 and may include a processor 198, one or more integrated circuits, and/or other components mounted thereto and configured to add a particular functionality to information handling system 102 (e.g., graphics card, video card, sound card, network interface card, TV or radio tuner card, host adapter card, etc.). Expansion card 196 may be mechanically and/or electrically coupled to motherboard 232 via expansion slot 235. For example, each expansion card 196 may include an edge connector configured to mount expansion card 196 in expansion slot 195. In some embodiments, expansion card 196 may be mechanically coupled to motherboard 232 such that expansion card 196 and/or the surfaces of integrated circuits mounted thereto may be substantially parallel to the surface of motherboard 232, as shown in FIGS. 2A-2D. In these and other embodiments, each expansion card 196 may be mechanically coupled to cold plate assembly 182 via one or more screws, fasteners, adhesives, and/or other suitable means Cold plate assembly 182 may include one or more cold plates 184 and one or more components configured to mechanically and thermally couple such cold plates to expansion cards 198. For example, as shown in FIGS. 2A-2D, cold plate assembly 182 may include one or more cold plates 184, one or more brackets 190, and one or more quick disconnect fluid fittings 192, 194. In some embodiments, cold plate assembly may be slidable relative to support member 210, in order to facilitate user-convenient fluidic coupling of cold plates 184 with quick disconnect fluid fitting 292 and fluid conduit 268, electrical coupling of expansion cards 196 to motherboard 232, and thermal coupling of components of expansion cards 196 to cold plates 184 as described in greater detail in FIGS. 6A-6E below.

Each cold plate 184 may be mechanically coupled to support member 210 via one or more screws, fasteners, adhesives, and/or other suitable means. Each cold plate 184 may be constructed from extruded aluminum, machined aluminum, case aluminum, and/or another suitable material. In some embodiments, all or one or more portions of each cold plate 184 may comprise a material (e.g., aluminum or other metal) that is generally thermally conductive.

Turning again briefly to FIG. 3A, each cold plate 184 may include fluid channels 310 and fluid microchannels 312 formed predominantly on the interior of such cold plate 184. Fluid channels 310 may include any suitable channel configured to transport fluid to, from, or within each cold plate 184 and may be formed by machining, extrusion, or other suitable manner. The position, length, height, width, and other physical characteristics of fluid channels 310 may be selected based on desired cooling characteristics, desired fluid flow rates, desired fluid type, component types, component locations, expected component heat generation, and/or any other suitable characteristics of information handling system 102. Fluid channels 310 of each cold plate 184 may be fluidically coupled to one or more of a bracket 190, a fluid microchannel 312, or another fluid channel 310.

Fluid microchannels 312 may include any suitable channel configured to transport fluid within each cold plate 184 and may be formed by machining, extrusion, or other suitable manner. The position, length, height, width, and other physical characteristics of fluid microchannels 312 may be selected based on desired cooling characteristics, desired fluid flow rates, desired fluid type, component types, component locations, expected component heat generation, and/or any other suitable characteristics of information handling system 102. In some embodiments, fluid microchannels 304 may be positioned at particular microchannel regions 186 within each cold plate 184. The microchannel regions 186 may be sized and/or located within each cold plate 184 such that when information handling system 102 is constructed, each microchannel region 186 is thermally coupled to a particular information handling resource (e.g., processor 198) by virtue of proximity between the fluid flowing in the fluid microchannel 312 and the information handling resource, and the presence of one or more generally thermally conductive materials (e.g., a portion of the surface of a particular cold plate) between the fluid and the information handling resource.

Turning again to FIGS. 2A-2D, each bracket 190 may be mechanically coupled to one or more of a cold plate 184 and an expansion card 196 via one or more screws, fasteners, adhesives, and/or other suitable means, and may include any system, device or apparatus configured to mechanically couple a cold plate 184 and/or expansion card 196 to support member 210. Each bracket 190 may also include fluid channels to fluidically couple a fluid channel 310 of a cold plate 184 to at least one of a quick disconnect fluid fitting 192, 194 or a fluid channel 310 of another cold plate 184.

Quick disconnect fluid fitting 192 may be made from plastic, rubber, or other suitable material and may be any system, device or apparatus configured to couple fluid channels 310 of cold plate 184*b* to fluid channels of support member 210 and/or fluid channels 302 of support member 220 via quick disconnect fluid fitting 292.

Quick disconnect fluid fitting 194 may be made from plastic, rubber, or other suitable material and may be any system, device or apparatus configured to couple fluid channels 310 of cold plate 184*a* to fluid conduit 268.

Figure 5A:
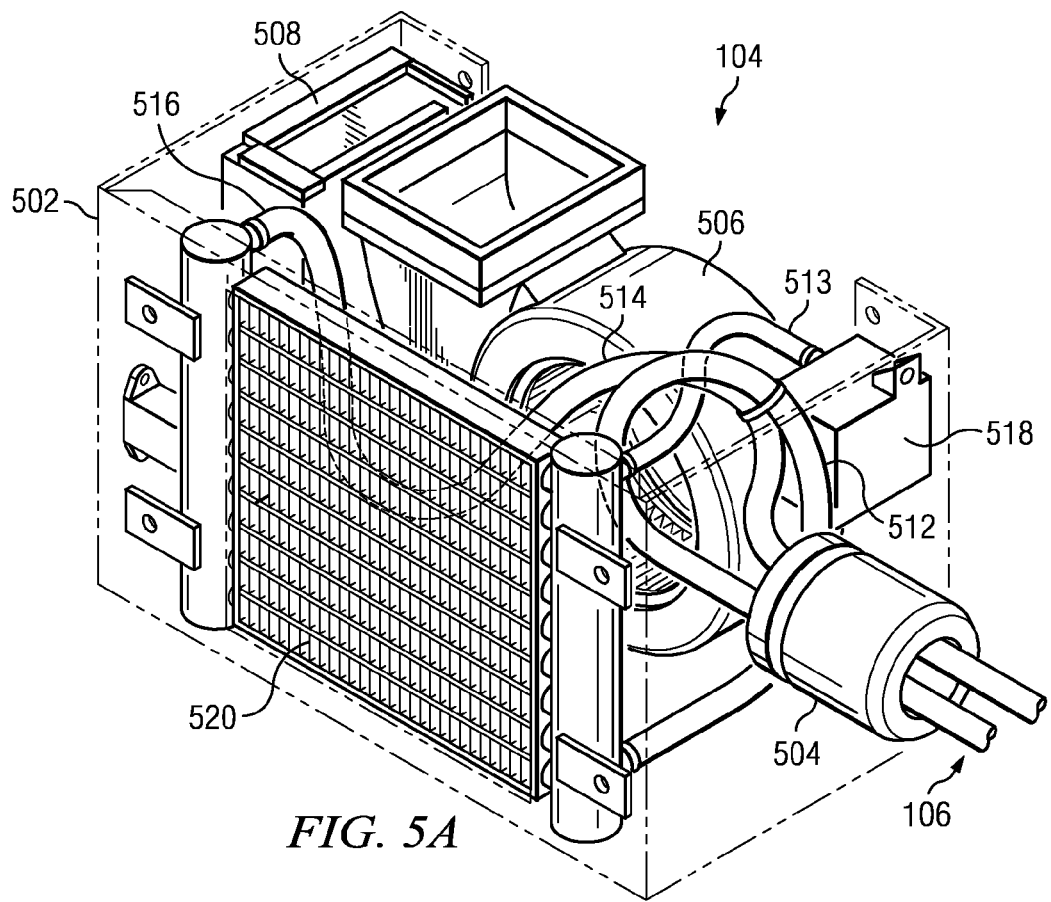
FIG. 5A illustrates an isometric view of selected components of a cooling unit, in accordance with embodiments of the present disclosure.
Figure 5B:
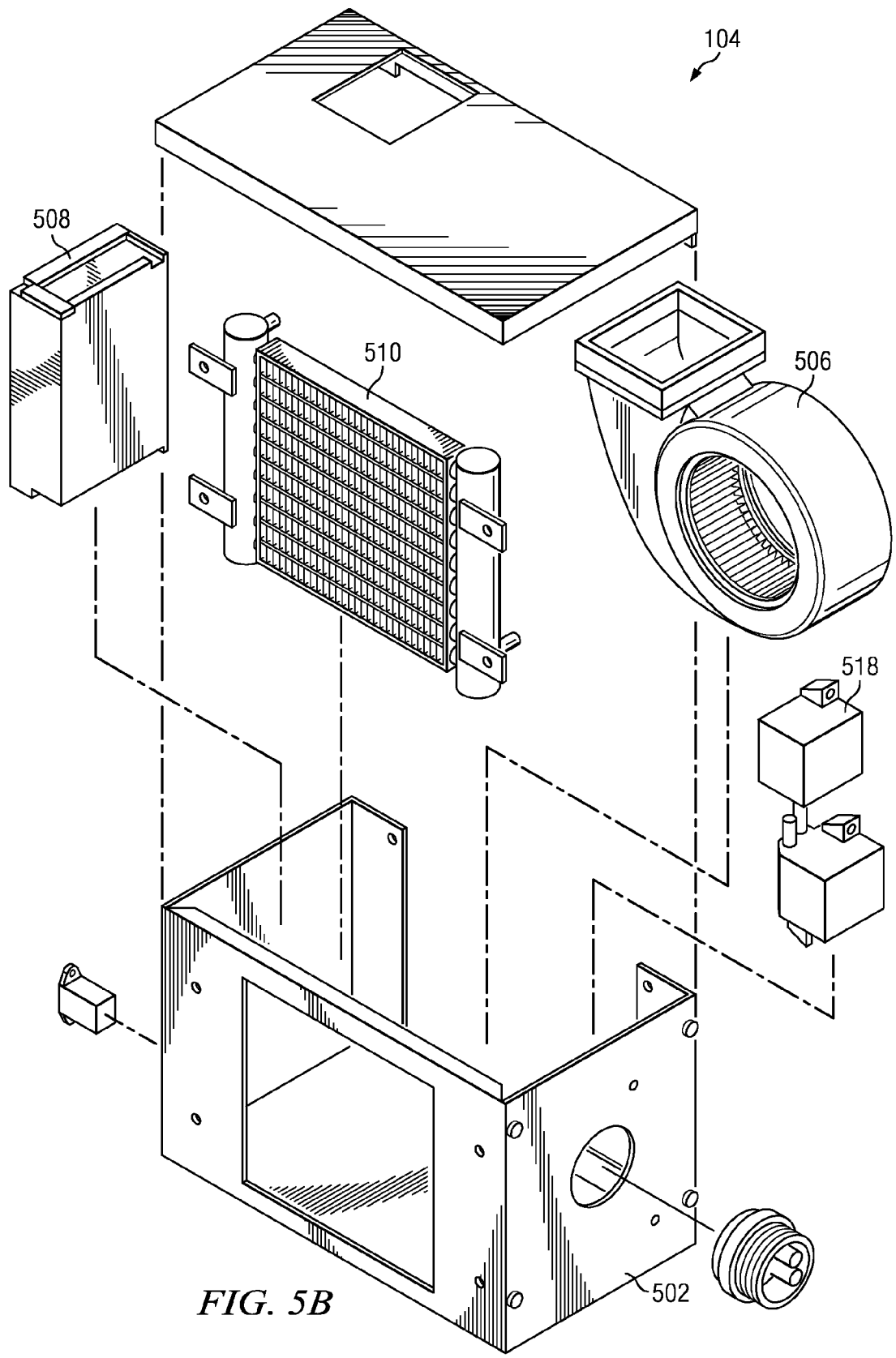
FIG. 5B illustrates an exploded view of selected components of the cooling unit depicted in FIG. 5A, in accordance with embodiments of the present disclosure.

FIGS. 5A-5B illustrate various views of selected components of cooling unit 104, in accordance with embodiments of the present disclosure. FIG. 5A illustrates an isometric view and FIG. 5B illustrates an exploded view. As shown in FIGS. 5A-5B, cooling unit 104 may include an enclosure 502, an umbilical assembly 504, a fan 506, a power supply 508, a radiator 510, and one or more fluid conduits 512, 513 and 514, and a pump 518.

Enclosure 502 may be any cabinet or housing suitable to house and/or mount various components cooling unit 104. Enclosure 502 may be constructed from aluminum, plastic, and/or any other suitable material.

Umbilical assembly 504 may be any system, device or apparatus configured to fluidically couple and/or electrically couple umbilical 106 to cooling unit 104. In some embodiments, umbilical assembly 504 may be identical or similar to umbilical assembly 204 depicted in FIGS. 2A-2D (e.g., may include an assembly cover and a fluidic coupler such as assembly cover 206 and fluidic coupler 208, for example).

Fan 506 may be any device, system or apparatus configured to produce an airflow proximate to radiator 510 and/or other components of cooling unit 104.

Power supply 508 may include any device, system, or apparatus configured to supply electrical energy to one or more components of, including without limitation, power fan 508 and pump 518.

Radiator 510 may include any device, system or apparatus configured to transfer thermal energy from one medium (e.g., fluid) to another (e.g., air) for the purpose of cooling and heating. In some embodiments, radiator 510 may include fluidic channels and/or conduits in at least a portion of radiator 510. Such fluidic channels and/or conduits may be fluidically coupled to one or more of fluid conduits 512, 513 and 514 and pump 518 (e.g., via one or more quick disconnect fluid fittings such as quick disconnect fluid fitting 516, for example).

One or more of fluid conduits 512, 513, 514 may include any device, system or apparatus for the conveyance of fluid (e.g., tubing, a pipe, a hollow cylinder). For example, as depicted in FIGS. 5A-5B, fluid conduit 512 may fluidically couple pump 518 to umbilical 106 and/or fluid conduit 514 may fluidically couple umbilical 106 to radiator 510. Other fluid conduits or channels not shown in FIGS. 5A-5B may also be present in cooling unit 104. Fluid conduits 512, 513 and 514 may be made of plastic, metal, and/or any other suitable material.

Pump 518 may be any device, system, or apparatus configured to produce a flow of fluid (e.g., fluid in one or more fluidic channels, conduits, etc. of information handling system 102, cooling unit 104 and/or umbilical 106). As shown in FIGS. 5A-5B, pump 518 may be fluidically coupled to umbilical 106 and radiator 510.

In operation, pump 518 may induce a flow of fluid (e.g., water, ethylene glycol, propylene glycol, or other coolant) through various fluidic channels, conduits, etc. of information handling system 102, cooling unit 104 and/or umbilical 106. For example, pump 518 may pump fluid from cooling unit 104 to fluid conduit 110 of umbilical 106 and then to fluid conduit of 168. From fluid conduit 168, fluid may flow to fluid conduit 170 where the fluid may be split into fluid conduits 172a and 172b, as shown by arrows in FIG. 3C.

From fluid conduits 172a and 172b, fluid may then flow into fluid channels 306 of support member 270. The fluid may then flow through the various fluid channels 306 and fluid microchannels 308 of support member 270 as shown by the arrows depicted in FIG. 3C. As fluid flows through fluid microchannels 308, heat generated by microprocessors 233 may be transferred to the fluid. In addition, heat generated by integrated circuits mounted on memory modules 282 may be transferred to heat sinks 284, and from heat sinks 284 to fluid flowing in fluid microchannels 308. Such transfers of heat may reduce the temperatures of microprocessors 233 and/or the integrated circuits mounted on memory modules 282.

Fluid may also flow from fluid channels 306, through quick disconnect fluid fittings 231 of support member 270 and quick disconnect fluid fittings 230 of support member 220, and into fluid channels 302 of support member 220. The fluid may then flow through the various fluid channels 302 and fluid microchannels 304 of support member 220 as shown by the arrows depicted in FIG. 3A. As fluid flows through fluid microchannels 304, heat generated by hard drives 258 and power source 262 may be transferred to the fluid. In addition, heat generated by integrated circuits mounted on memory modules 252 may be transferred to heat sinks 254, and from heat sinks 254 to fluid flowing in fluid microchannels 304. Such transfers of heat may reduce the temperatures of hard drives 258, power source 262, and/or the integrated circuits mounted on memory modules 252.

Fluid may also flow from fluid channels 302, through quick disconnect fluid fitting 292 of support member 220 and quick disconnect fluid fitting 192 of cold plate assembly 182, through a fluid channel of bracket 190a, and through fluid channels 310 of cold plate 184b. The fluid may then flow through the various fluid channels 310 and fluid microchannels 312 of cold plate 184b as shown by the arrows depicted in FIG. 3A. Fluid may flow from fluid channels 310 of cold plate 184b, through a fluid channel of bracket 190b, and into fluid channels 310 of cold plate 184a. The fluid may then flow through the various fluid channels 310 and fluid microchannels 312 of cold plate 184a as shown by the arrows depicted in FIG. 3A. As fluid flows through fluid microchannels 312, heat generated by processors 198 may be transferred to the fluid. Such transfers of heat may reduce the temperatures of processors 198.

Fluid may also flow from fluid channels 310 of cold plate 184a, through quick disconnect fluid fitting 194, through fluid conduit 268, and into fluid conduit 108 of umbilical 106.

From fluid conduit 108 of umbilical 106, fluid may flow through fluid conduit 514 of cooling unit 104 and into fluid channels and/or conduits of radiator 510. As fluid flows through radiator 510, heat present in the fluid may be transferred to media (e.g., air or other fluid) flowing proximate to radiator 510 (e.g., air blown from fan 506, through radiator 510 and to the exterior of cooling unit 104). Such transfers of heat may reduce the temperature of the fluid. Thus, ultimately, heat generated by processors 233, hard drives 258, power source 262, processors 198, integrated circuits mounted to memory modules 252, 282, and/or other information handling resources may be transferred to media (e.g., air) proximate to cooling unit 104.

FIGS. 6A-6E illustrate fluidic coupling of cold plates 184 with quick disconnect fluid fitting 292 and fluid conduit 268, electrical coupling of expansion cards 196 to motherboard 232, and thermal coupling of components of expansion cards 196 to cold plates 184, in accordance with embodiments of the present disclosure.

As shown in FIGS. 6A-6E, support member 210 may have coupled thereto one or more guides 602. Each guides 602 may be any system, device or apparatus configured to couple a corresponding bracket 190a, 190b, or 190c to support member 210 such that cold plate assembly 182 may slide relative to support member 210. While cold plate assembly is in a first position (e.g., an "up" or "out" position), one or more expansion cards 196 may be mechanically coupled to corresponding cold plates 184a or 184b via screws 606 and/or other suitable means (e.g., fasteners, adhesives). The mechanical coupling of an expansion card 196 to a corresponding cold plate 184a, 184b, may cause contact between components of the expansion card 196 (e.g., a processor 198) and a surface of the corresponding cold plate 184a, 184b, such that such components may be thermally coupled to fluidic channels 310 and/or fluidic microchannels 312 of the corresponding cold plate 184a, 184b, as previously described in this disclosure.

In certain embodiments of the present disclosure, one or more of quick disconnect fluid fittings 192, 194, and 292 may be "dripless" such that the quick disconnect fluid fittings 192 and 292 do not release fluid when not engaged to each other, and quick disconnect fluid fitting 194 does not release fluid when not engaged to fluid conduit 268. Accordingly, cold plate assembly 182 may be placed in the first position (e.g., the "up" or "out" position), without requiring draining and/or flushing of fluid in system 100, or without requiring recharging of the fluid in system 100 after quick disconnect fluid fittings 192, 194, and 292 are re-engaged, as described below.

Figure 6A:
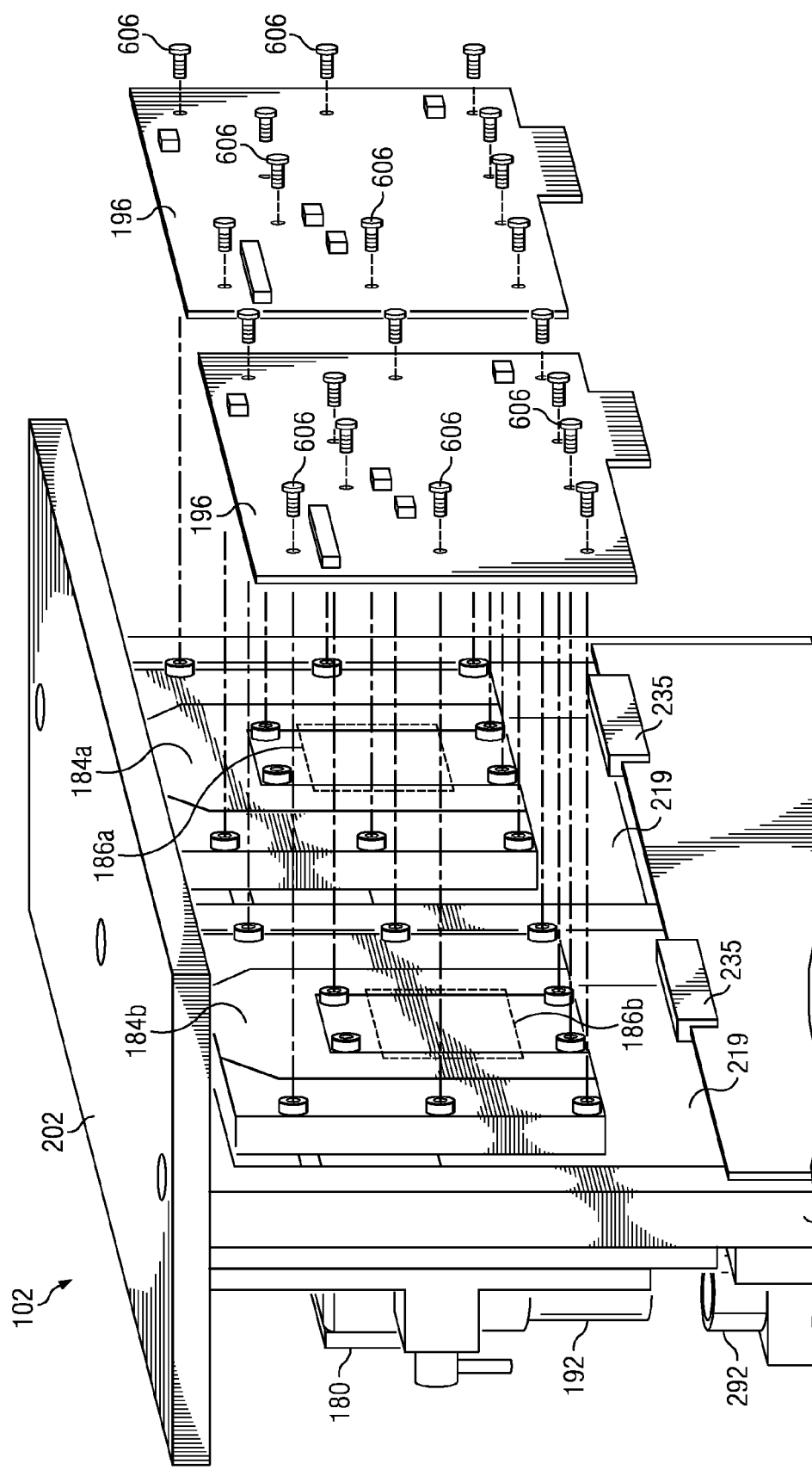
FIGS. 6A-6E illustrate the electrical, mechanical, and thermal coupling of expansion cards to other components of an information handling system, in accordance with embodiments of the present disclosure.
Figure 6B:
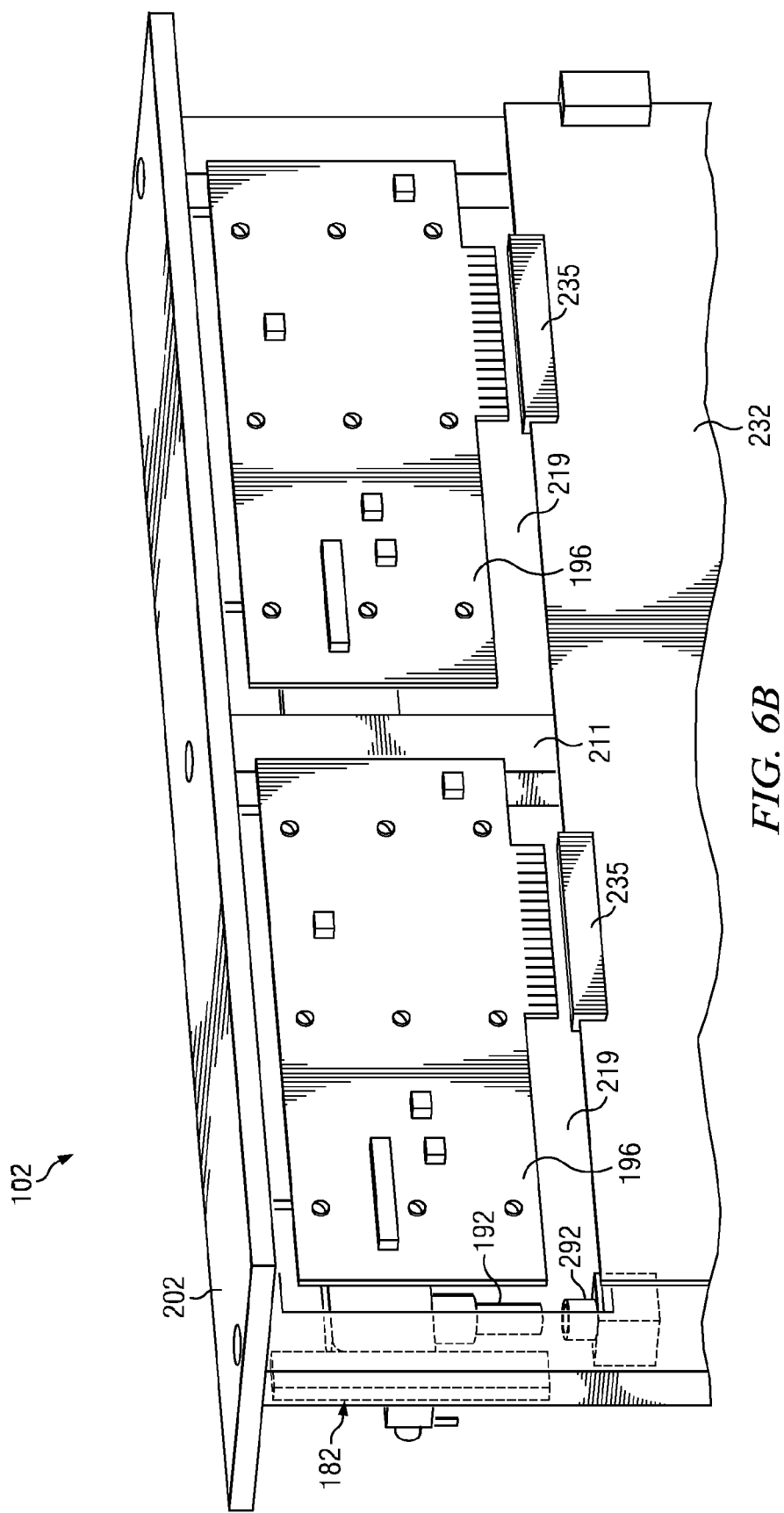
Figure 6C:
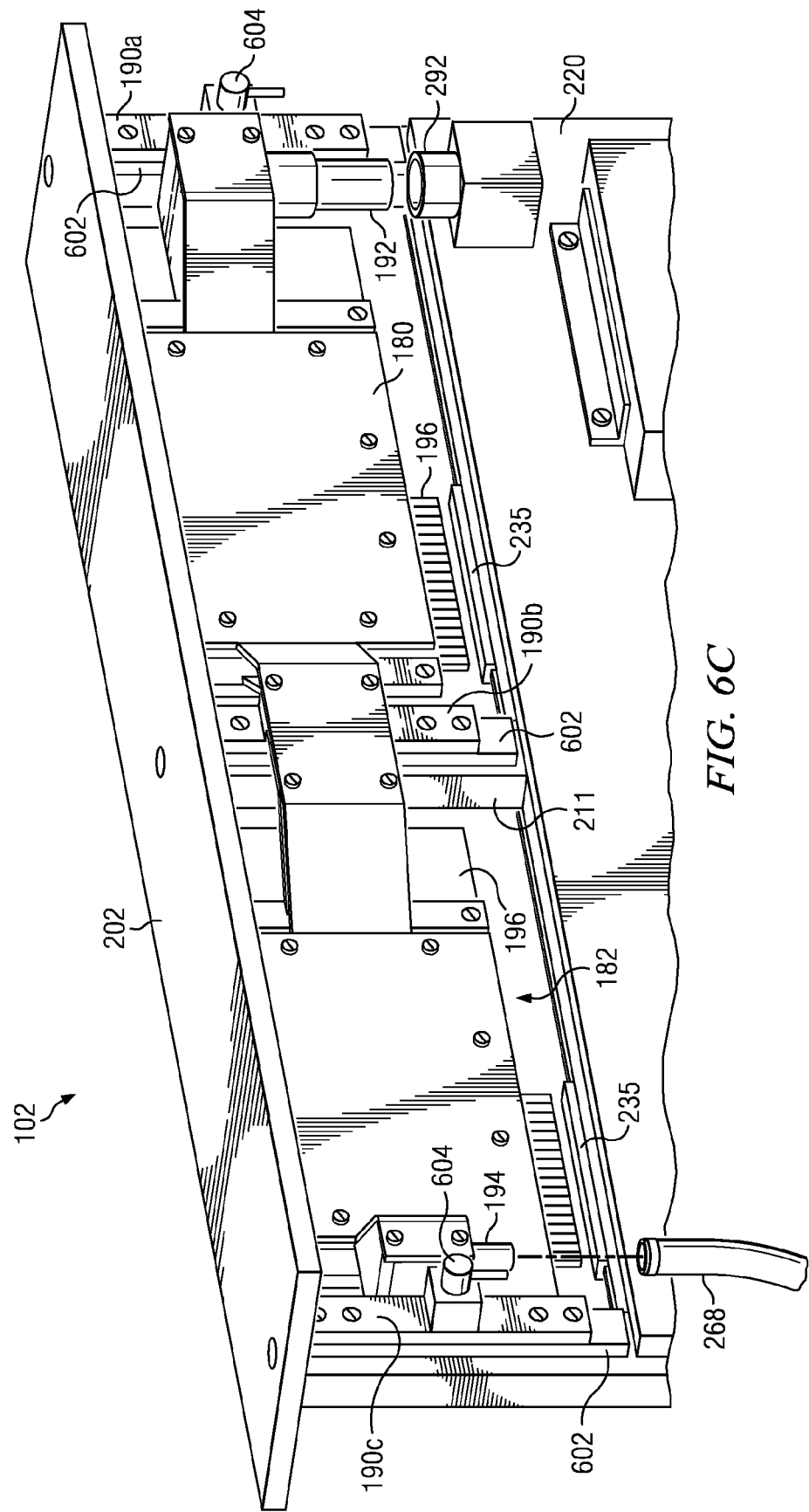
Figure 6D:
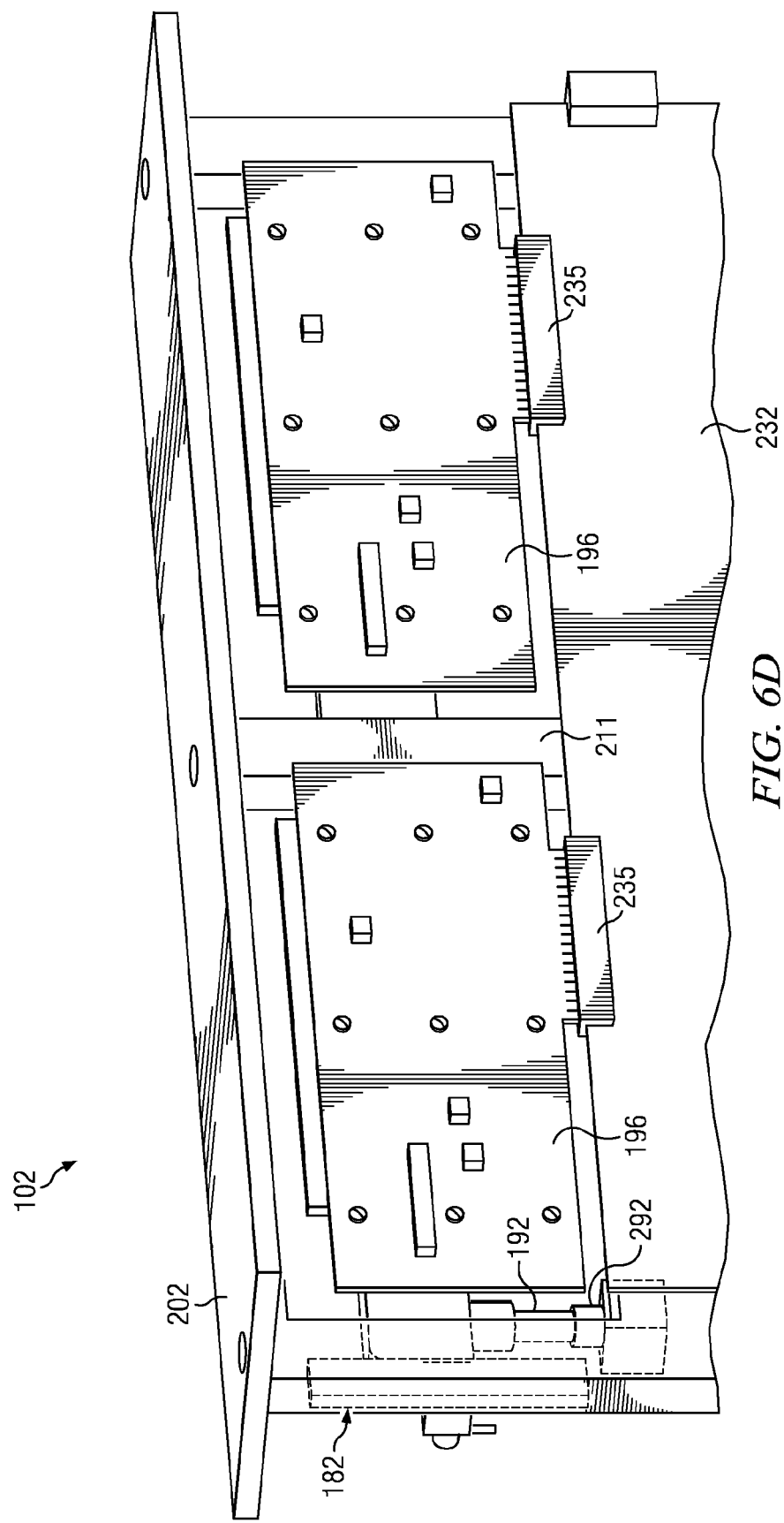
Figure 6E:
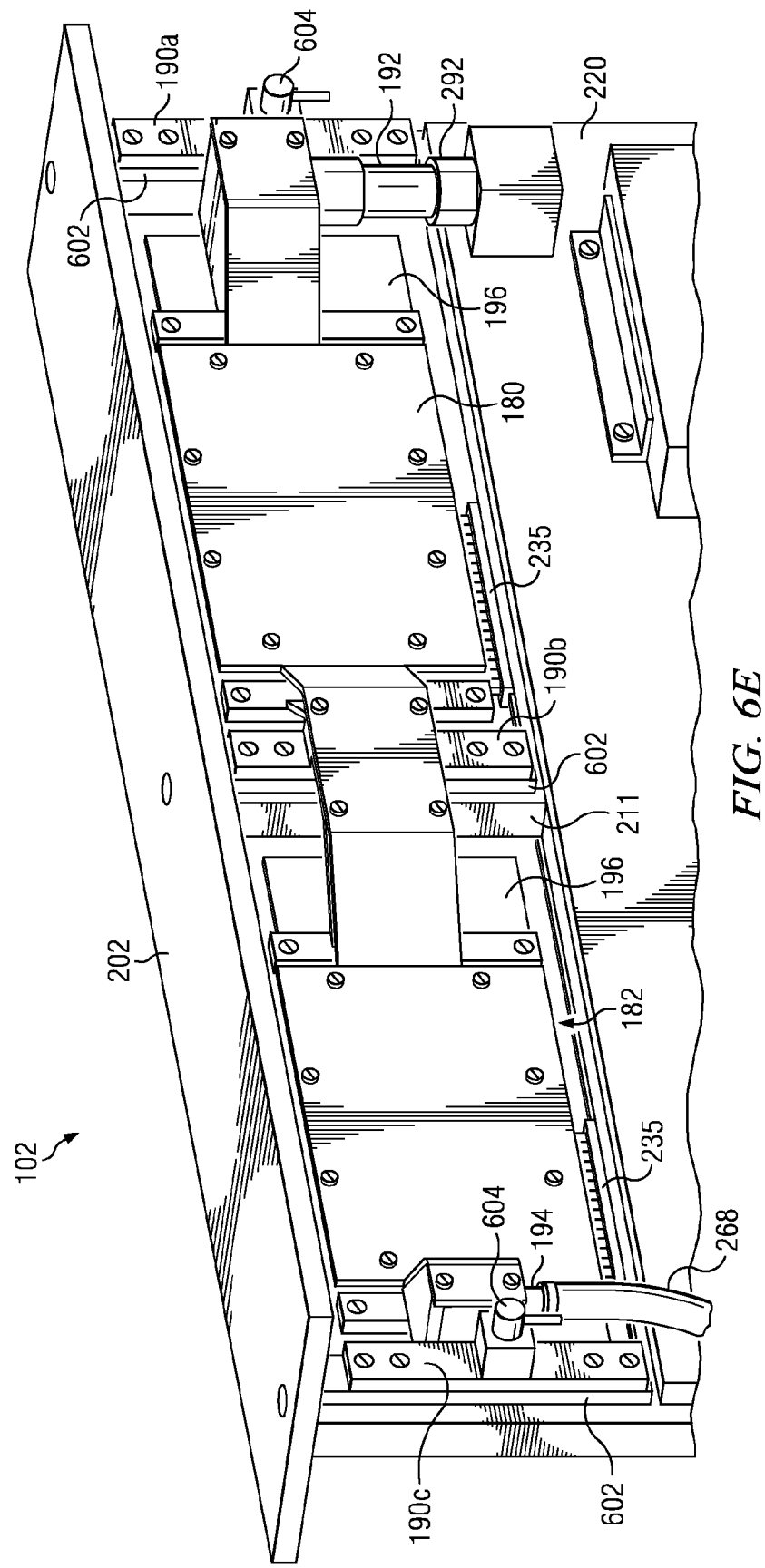

In operation, cold plate assembly 182 may be slidably coupled to support member 210 (e.g., via brackets 190a-190c and guides 602) such that cold plate assembly 182 may be slid between the first position (e.g., the "up" or "out" position) described above and depicted in FIGS. 6B and 6C, to a second position (e.g., a "down" or "in" position) depicted in FIGS. 6D and 6E, and vice versa. Brackets 190a and 190c may have pins 604 or other suitable component configured to lock and/or temporarily fix cold plate assembly 182 in either of the first position or second position. For example, pins 604 may be spring loaded pins that engage with a corresponding portion of a guide 602 to lock or temporarily fix cold plate assembly 182 in either of the first position or second position until such time that a user of system 100 may actuate such pins to unlock the cold plate assembly to allow movement from the first position to the second position, or vice versa.

When slid from the first position to the second position, cold plate assembly 182 may be aligned and configured such that quick disconnect fluid fitting 192 may engage quick disconnect fluid fitting 292, and quick disconnect fluid fitting 194 may engage fluid conduit 268, thus completing the fluidic path throughout system 100. In addition, when one or more expansion cards 196 are mechanically coupled to cold plate assembly 182, such expansion cards 196 may be aligned and configured such that expansion cards 196 electrically engage with corresponding expansion slots 235 on motherboard 232.

Thus, the sliding cold plate assembly 182 may advantageously allow for addition and/or removal of expansion cards 196 without requiring removal of cold plates 184a, 184b or the drainage, flushing or recharge of fluid in system 100. Notably, cold plate assembly 182 may be engaged in the second position (e.g., the "down" or "in" position) to complete the fluidic path throughout system 100 regardless of the number of expansion cards 196 used, or regardless of the presence of expansion cards 196.

Although the description above discusses the ultimate transfer of heat from processors 233, hard drives 258, power source 262, processors 198, and integrated circuits mounted to memory modules 252, 282, systems and methods similar to those disclosed above may be used to cool information handling resources other than those discussed above.

Using the methods and systems disclosed herein, problems associated with traditional approaches to cooling information handling resources may be reduced or eliminated. For example, methods and systems disclosed herein may provide a technique for cooling information handling resources within an information handling system without the need for mechanical fans in the information handling system or without transferring heat generated by such information handling resources to air immediately proximate to the information handling system.

The methods and systems disclosed herein also allow for cooling of information handling resources in information handling systems of various configurations. For example, the methods and systems disclosed herein provide for cooling a processor and other information handling resources mounted to a motherboard, as well cooling of off-motherboard information handling resources with surfaces substantially parallel to that of the surface of the motherboard (e.g., processors 198 of expansion cards 196), and with surfaces substantially perpendicular to that of the surface of the motherboard (e.g., integrated circuits mounted to memory modules 252, 282). It is noted that while the various embodiments discussed above contemplate the cooling of memory modules with components having surfaces perpendicular to a surface of a motherboard, methods and systems identical or similar to those disclosed above may be used to provide for cooling of other information handling resources with surfaces perpendicular to that of a motherboard (e.g., expansion cards) and/or to provide for cooling of memory modules with component surfaces in other positions relative to the surface of the motherboard. It is also noted that while the various embodiments discussed above contemplate the cooling of expansion cards with component surfaces parallel to a surface of a motherboard, methods and systems identical or similar to those disclosed above may be used to provide for cooling of other information handling resources with surfaces parallel to that of a motherboard (e.g., memory modules) and/or to provide for cooling of expansion cards with component surfaces in other positions relative to the surface of the motherboard.

In addition, the methods and systems disclosed herein further provide for structural elements (e.g., support members 220 and 270) that provide structural support for an information handling system and its various components as well as a housing for fluidic channels used to convey the fluid used to cool the various components.

Although the present disclosure has been described in detail, it should be understood that various changes, substitutions, and alterations can be made hereto without departing from the spirit and the scope of the disclosure as defined by the appended claims.

What is claimed is:

1. An information handling system comprising:
   a first and a second information handling resource;
   a first support member including:
      an exterior surface for supporting the first and the second information handling resources;
      a fluid channel embedded in an interior of the first support member and fluidically coupled to a fluid fitting; and
      a first fluid microchannel region and a second fluid microchannel region embedded in the interior of the first support member and fluidically coupled to the fluid channel, the first fluid microchannel region configured to convey a flowing fluid proximate to the first information handling resource at a first fluid flow rate such that heat generated by the first information handling resource is transferred to the flowing fluid, the second fluid microchannel region configured to convey a flowing fluid proximate to the second information handling resource at a second fluid flow rate such that heat generated by the second information handling resource is transferred to the flowing fluid, the first fluid flow rate being different from the second fluid flow rate; and
   an enclosure configured to enclose the first and the second information handling resources and the first support member, the enclosure configured such that no air flows between the inside of the enclosure and the outside of the enclosure, the enclosure including:
      a second support member which divides the enclosure into a first space and a second space; and
      the first support member located in the first space and the fluid fitting fluidically communicates through the second support member with a complementary fluid fitting of a third support member, the third support member located in the second space of the enclosure.

2. The information handling system of claim 1, wherein the fluid channel is configured based on a third fluid flow rate.

3. The information handling system of claim 1, wherein the fluid channel and the first fluid microchannel region are configured based on a fluid type.

4. The information handling system of claim 1, wherein the fluid channel and the first fluid microchannel region are configured based on the location of the first information handling resource.

5. The information handling system of claim 1, wherein the fluid fitting is a quick connect fluid fitting.

6. The information handling system of claim 1, wherein the fluid channel is fluidically coupled to a second fluid channel.

7. The information handling system of claim 1, wherein the fluid channel is fluidically coupled to a fluid conduit.

8. The information handling system of claim 1, wherein the enclosure is further configured such that heat transferred from the interior of the enclosure to the exterior of the enclosure is transferred to the flowing fluid.

9. A method for cooling information handling resources, comprising:
- enclosing a first and a second information handling resource and a first support member with an enclosure, the enclosure configured such that no air flows between the inside of the enclosure and the outside of the enclosure, the enclosure including:
  - a second support member which divides the enclosure into a first space and a second space; and
  - the first support member located in the first space and having a fluid fitting that fluidically communicates through the second support member with a complementary fluid fitting of a third support member, the third support member located in the second space of the enclosure;
- conveying a flowing fluid to the first support member, the first support member including:
  - an exterior surface for supporting the first and the second information handling resources;
  - a fluid channel embedded in an interior of the first support member and fluidically coupled to the fluid fitting; and
  - a first fluid microchannel region and a second fluid microchannel region embedded in the interior of the first support member and fluidically coupled to the fluid channel;
- conveying the flowing fluid through the first fluid microchannel region proximate to the first information handling resource at a first fluid flow rate such that heat generated by the first information handling resource is transferred to the flowing fluid; and
- conveying the flowing fluid to the second fluid microchannel region proximate to the second information handling resource at a second fluid flow rate such that heat generated by the second information handling resource is transferred to the flowing fluid, the first fluid flow rate being different from the second fluid flow rate.

10. The method of claim 9, wherein the fluid channel is configured based on a third fluid flow rate.

11. The method of claim 9, wherein the fluid channel and the first fluid microchannel region are configured based on a fluid type.

12. The method of claim 9, further comprising conveying the flowing fluid to a fluid conduit.

13. The method of claim 9, wherein the fluid channel and the first fluid microchannel region are configured based on the location of the first information handling resource.

14. The method of claim 9, wherein the fluid fitting is a quick connect fluid fitting.

15. The method of claim 9, wherein the fluid channel is fluidically coupled to a second fluid channel.

* * * * *